(12) United States Patent
Lopez et al.

(10) Patent No.: US 11,563,148 B2
(45) Date of Patent: Jan. 24, 2023

(54) LIGHT-EMITTING DEVICE WITH CONFIGURABLE SPATIAL DISTRIBUTION OF EMISSION INTENSITY

(71) Applicant: LUMILEDS LLC, San Jose, CA (US)

(72) Inventors: Toni Lopez, Vaals (NL); Floris Crompvoets, Aachen (DE)

(73) Assignee: Lumileds LLC, San Jose, CA (US)

( * ) Notice: Subject to any disclaimer, the term of this patent is extended or adjusted under 35 U.S.C. 154(b) by 168 days.

(21) Appl. No.: 17/142,960

(22) Filed: Jan. 6, 2021

(65) Prior Publication Data

US 2021/0358997 A1    Nov. 18, 2021

Related U.S. Application Data

(63) Continuation-in-part of application No. 16/875,237, filed on May 15, 2020.

(51) Int. Cl.
| | |
|---|---|
| *H01L 33/38* | (2010.01) |
| *H01L 27/15* | (2006.01) |
| *H05B 47/155* | (2020.01) |
| *H01L 33/46* | (2010.01) |
| *H05B 45/30* | (2020.01) |

(Continued)

(52) U.S. Cl.
CPC .......... *H01L 33/382* (2013.01); *H01L 27/156* (2013.01); *H01L 33/42* (2013.01); *H01L 33/46* (2013.01); *H01L 33/60* (2013.01); *H05B 45/30* (2020.01); *H05B 47/155* (2020.01)

(58) Field of Classification Search
CPC ........ H01L 33/62; H01L 33/382; H01L 33/60
See application file for complete search history.

(56) References Cited

U.S. PATENT DOCUMENTS

| 8,754,425 B2 | 6/2014 | Anderson et al. |
| 2010/0213485 A1 | 8/2010 | McKenzie et al. |

(Continued)

FOREIGN PATENT DOCUMENTS

| EP | 2584618 A2 | 4/2013 |
| EP | 3182451 A2 | 6/2017 |

(Continued)

OTHER PUBLICATIONS

The extended European search report corresponding to EP 20180007.5 dated Nov. 12, 2020, 10 pages.

(Continued)

*Primary Examiner* — Feifei Yeung Lopez

(57) ABSTRACT

A semiconductor light-emitting device includes a junction between doped semiconductor layers, a first set of multiple independent contacts connected to a first doped layer and a second set of one or more contacts connected to the second doped layer. Multiple conductive vias connect the independent contacts to the first doped layer, enabling differing corresponding via currents to be applied to the first doped layer through the vias independent of one another. A spatial distribution of via currents among the multiple vias can be selected to yield a corresponding spatial distribution of emission intensity. Alteration of the via current distribution results in corresponding alteration of the emission intensity distribution; such alterations can be implemented dynamically. Multiple devices can be arranged as a light-emitting array.

20 Claims, 28 Drawing Sheets

(51) Int. Cl.
*H01L 33/42* (2010.01)
*H01L 33/60* (2010.01)

(56) References Cited

U.S. PATENT DOCUMENTS

| | | |
|---|---|---|
| 2011/0210362 A1 | 9/2011 | Lee et al. |
| 2012/0051075 A1 | 3/2012 | Harada et al. |
| 2012/0051079 A1 | 3/2012 | Saito et al. |
| 2014/0151739 A1 | 6/2014 | Koizumi et al. |
| 2016/0284927 A1 | 9/2016 | Cho et al. |
| 2017/0210277 A1 | 7/2017 | Harada et al. |
| 2017/0236866 A1 | 8/2017 | Lee et al. |
| 2020/0013761 A1* | 1/2020 | Chaji .................. H01L 25/0753 |
| 2020/0287088 A1* | 9/2020 | Jeon ........................ H01L 33/62 |
| 2021/0359179 A1 | 11/2021 | Lopez et al. |

FOREIGN PATENT DOCUMENTS

| | | |
|---|---|---|
| KR | 2011-0085726 A | 7/2011 |
| KR | 10-149331 B1 | 2/2015 |
| WO | 2014/105403 A1 | 7/2014 |
| WO | 2017/119743 A1 | 7/2017 |

OTHER PUBLICATIONS

Compound Semiconductor, "SiC MOSFETs", www.compoundsemiconductor.net, vol. 23 Issue 2, Mar. 2017, 10 pages.
From the Korean Intellectual Property Office as the ISA, "Notification of Transmittal of the International Search Report and the Written Opinion of the International Searching Authority, or the Declaration", corresponding to PCT/US2021/032312, Aug. 31, 2021, 11 pages.

* cited by examiner

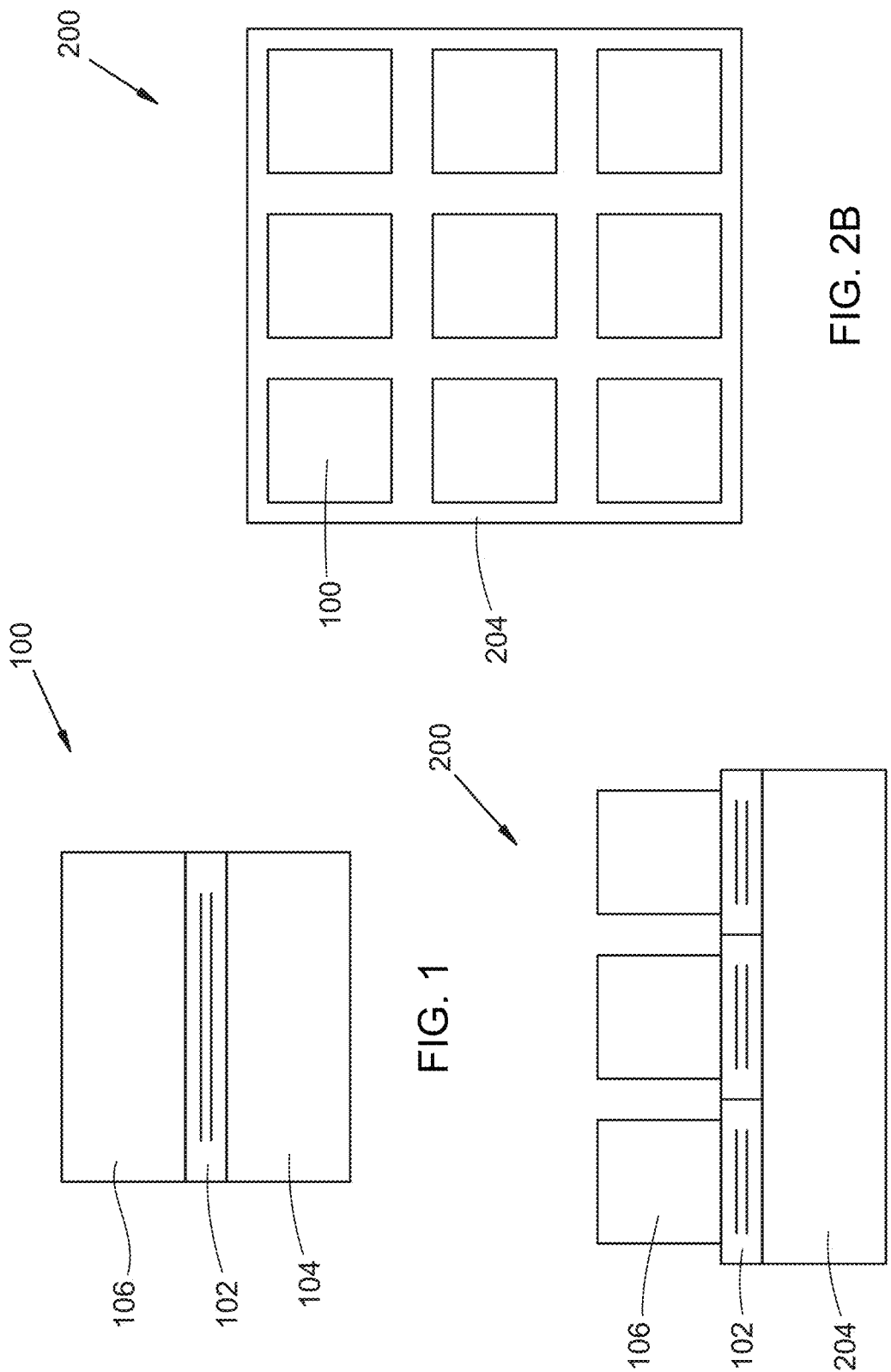

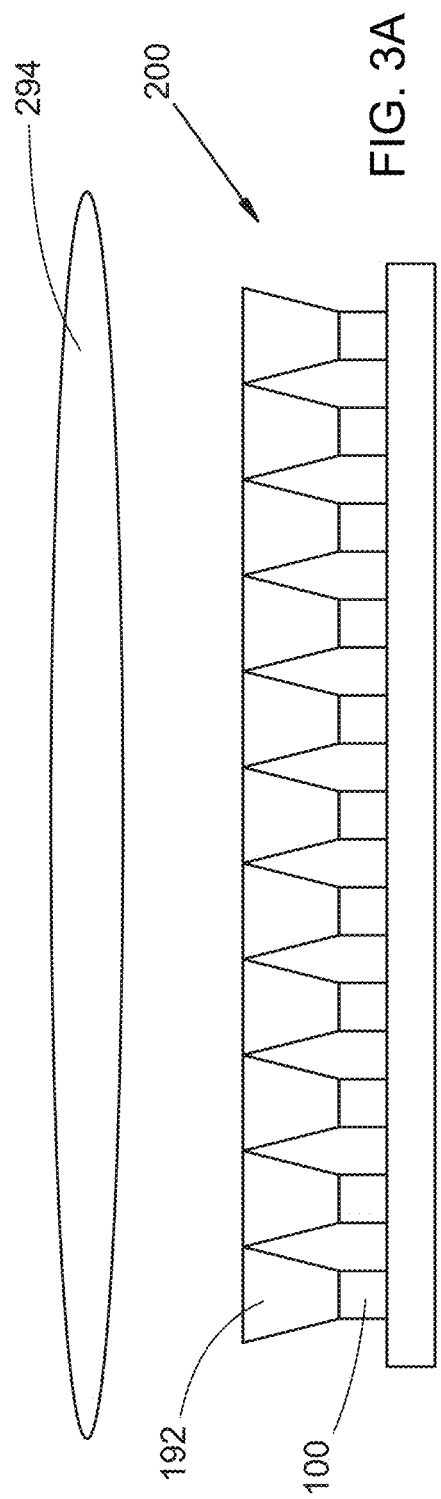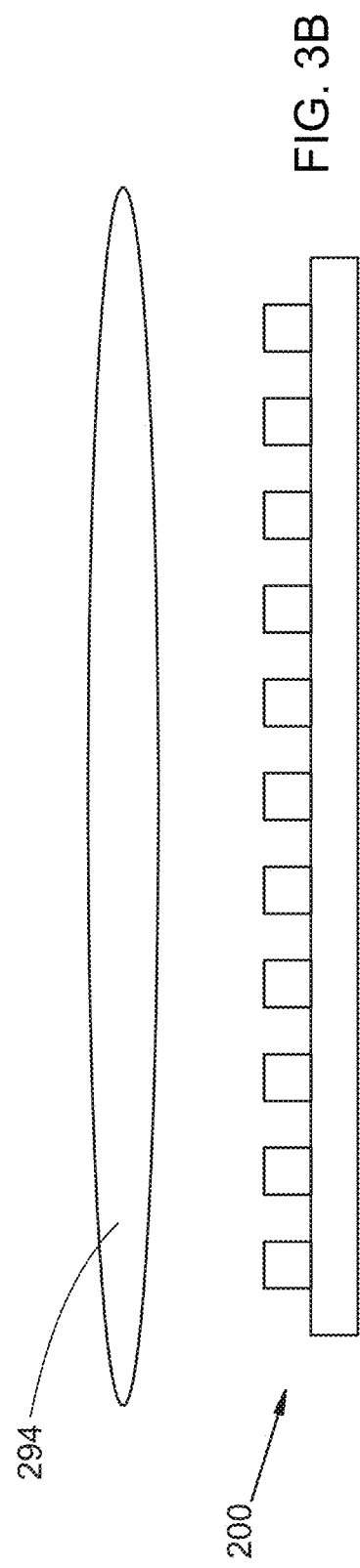

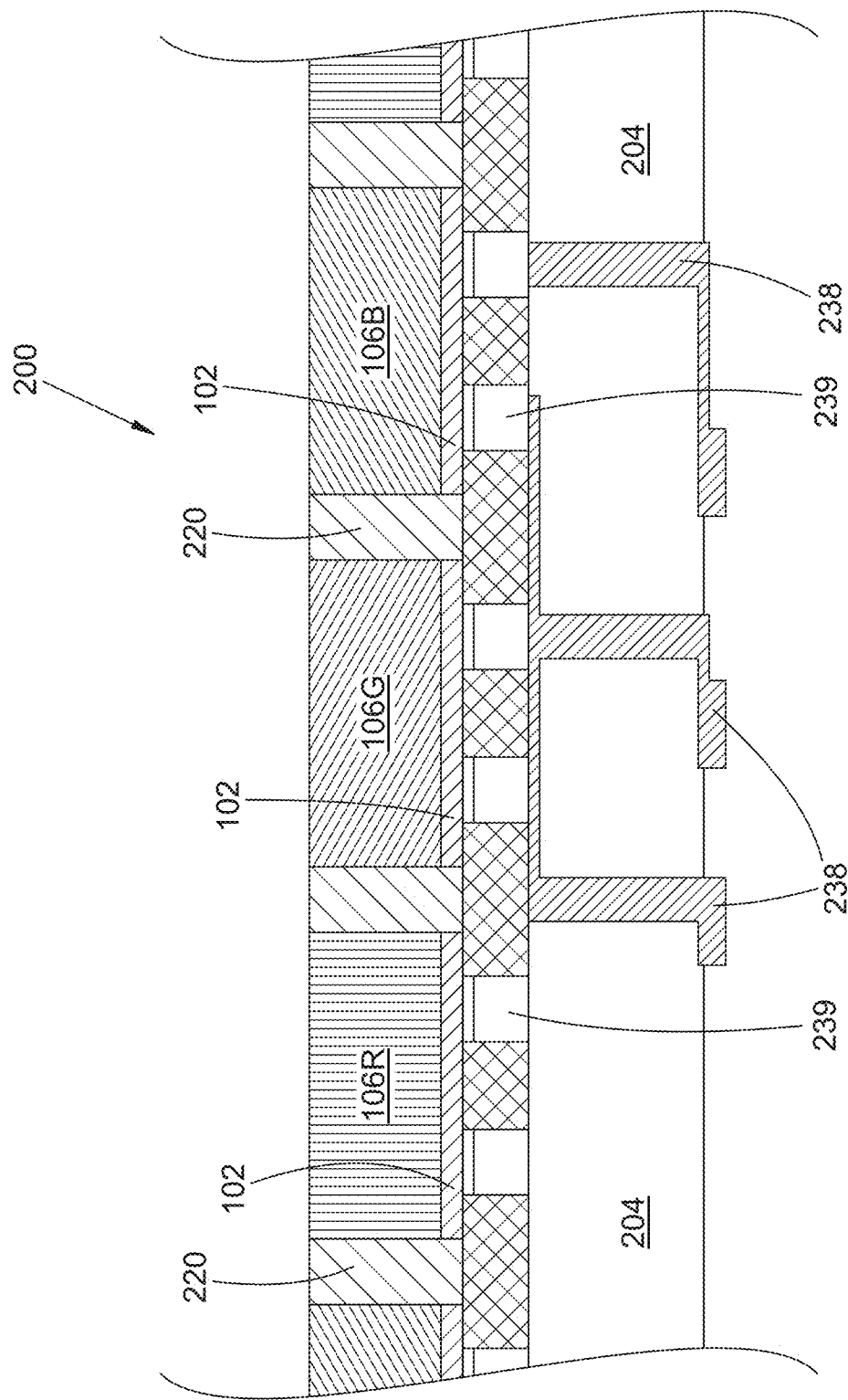

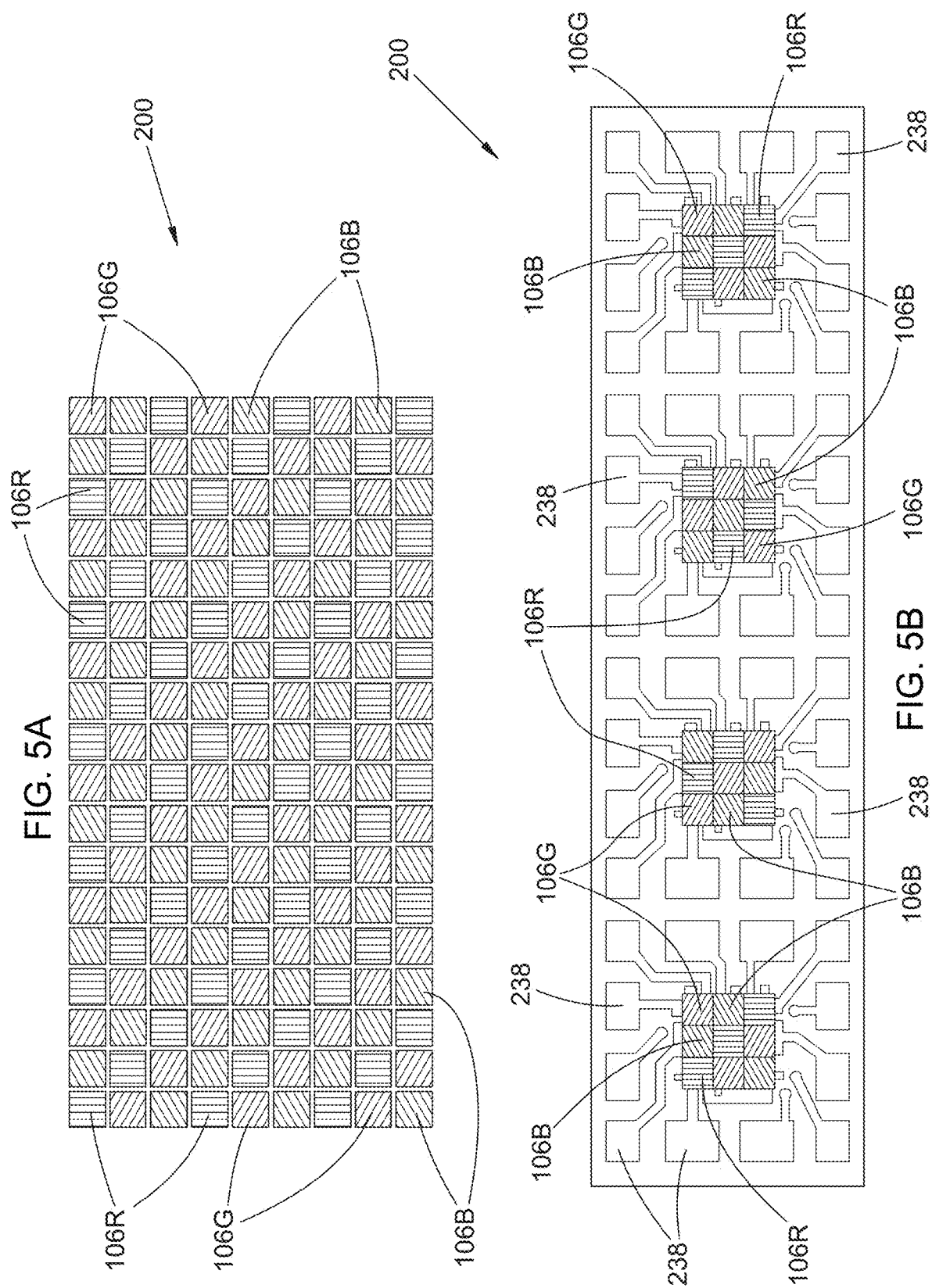

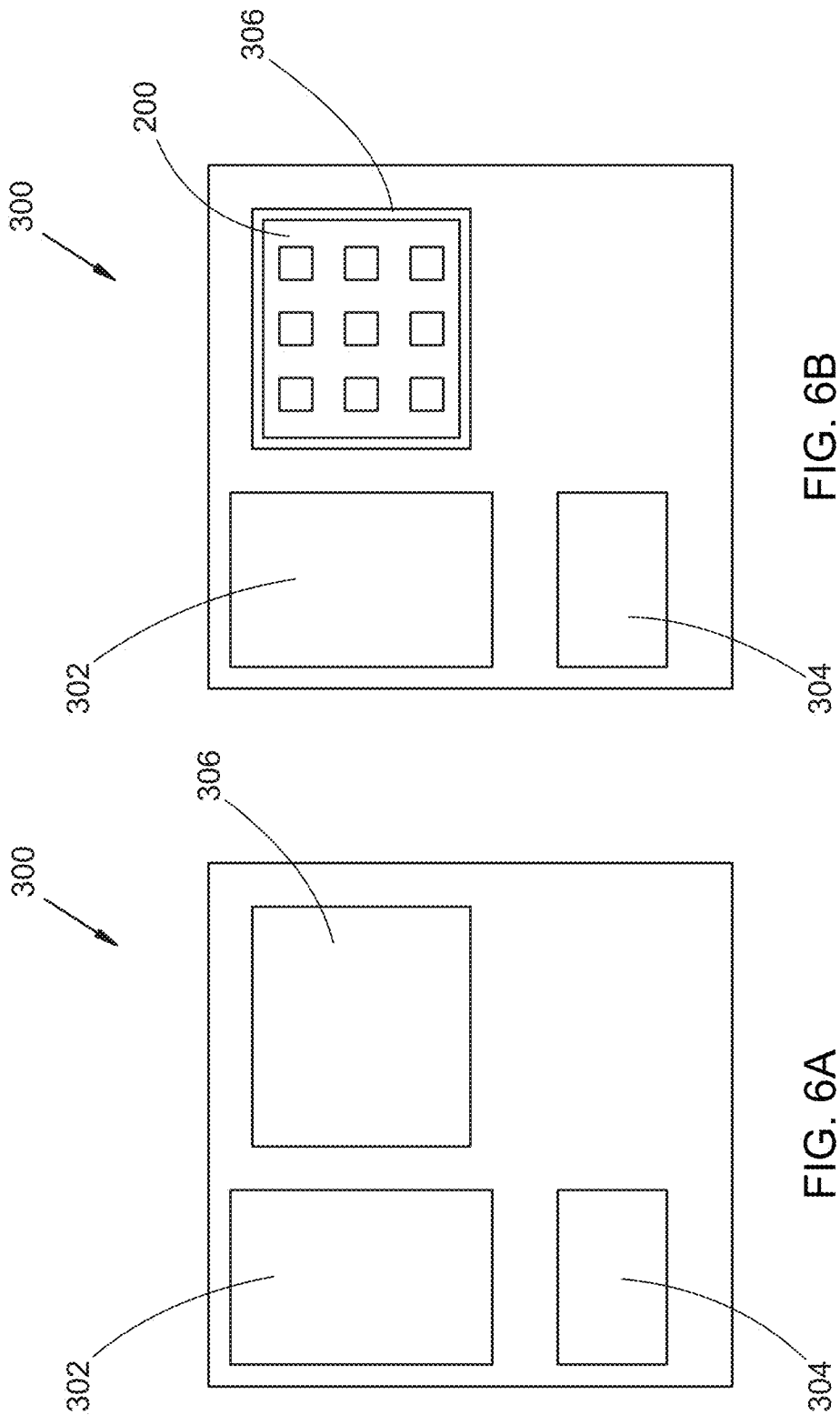

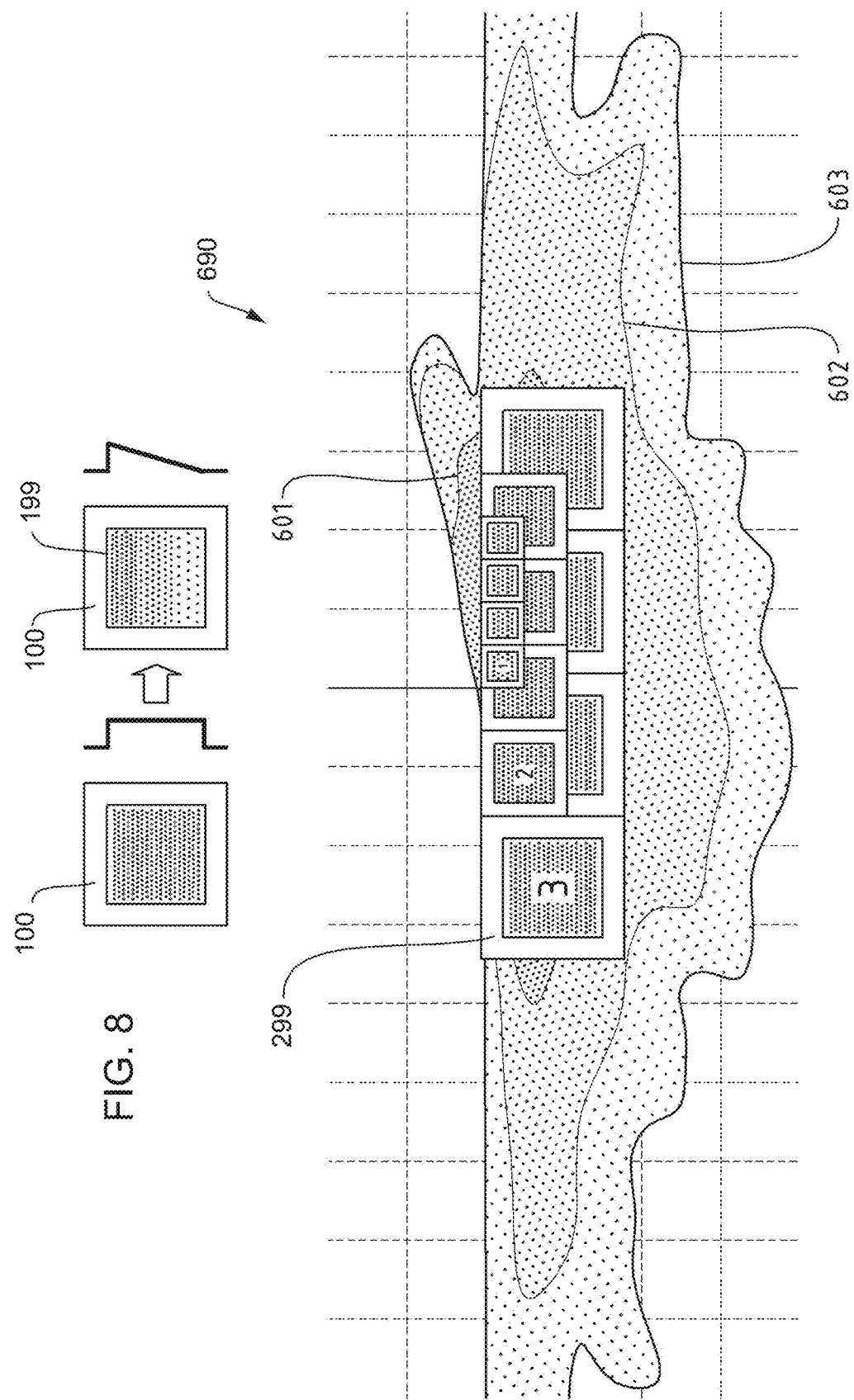

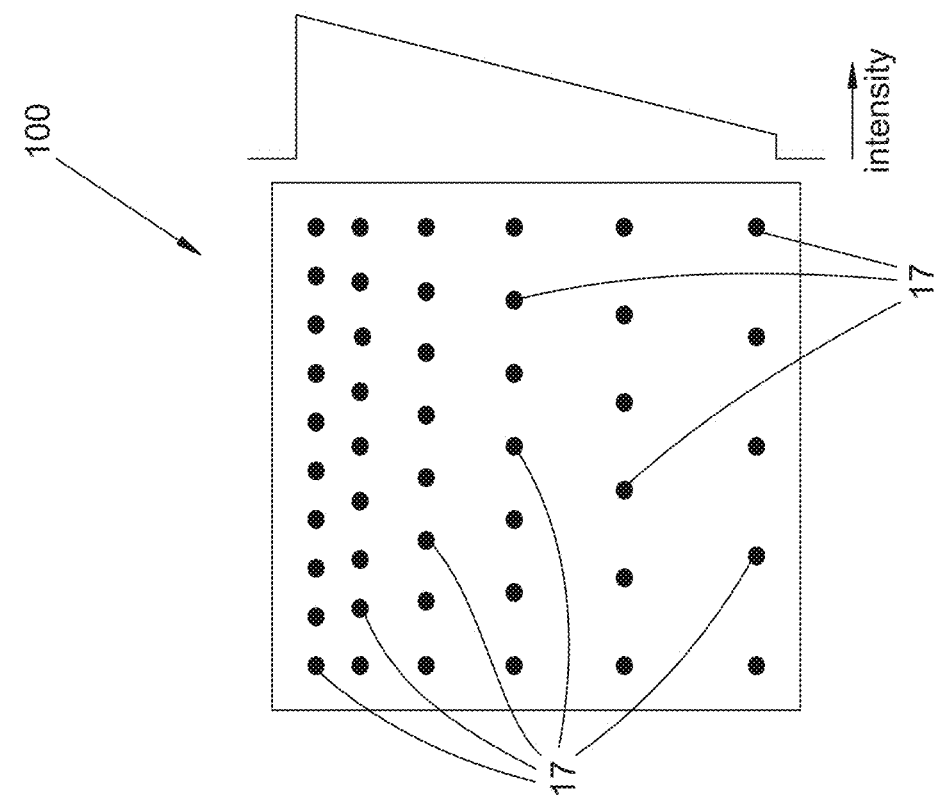
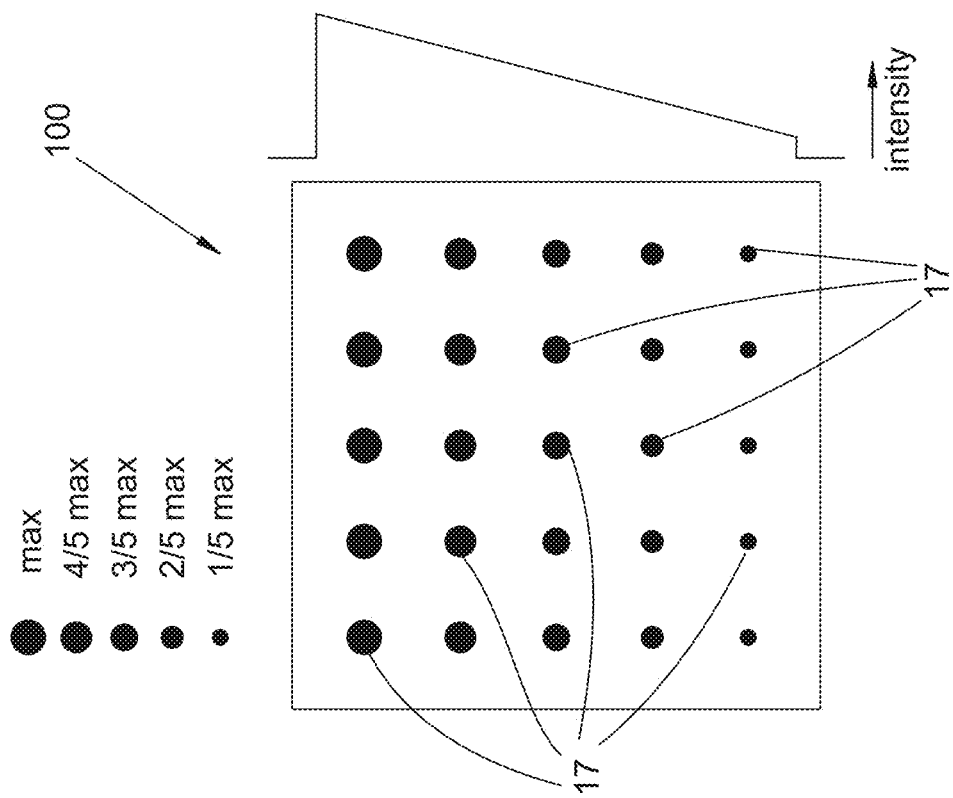
FIG. 13A
FIG. 13B

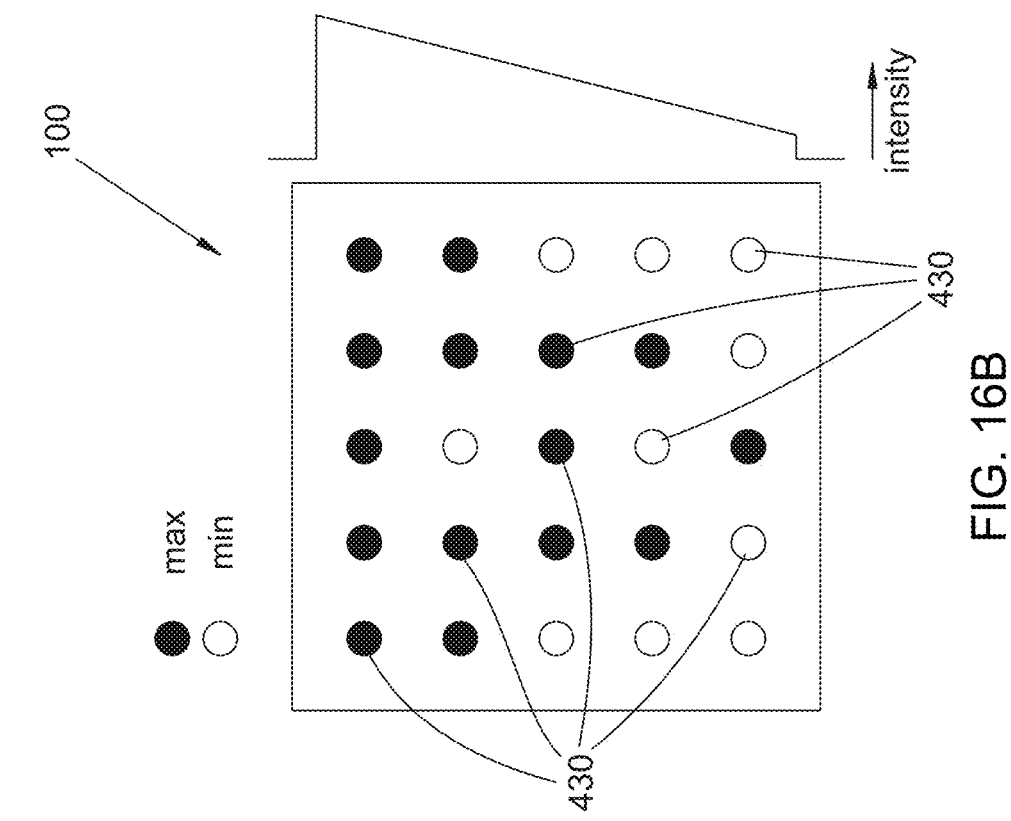
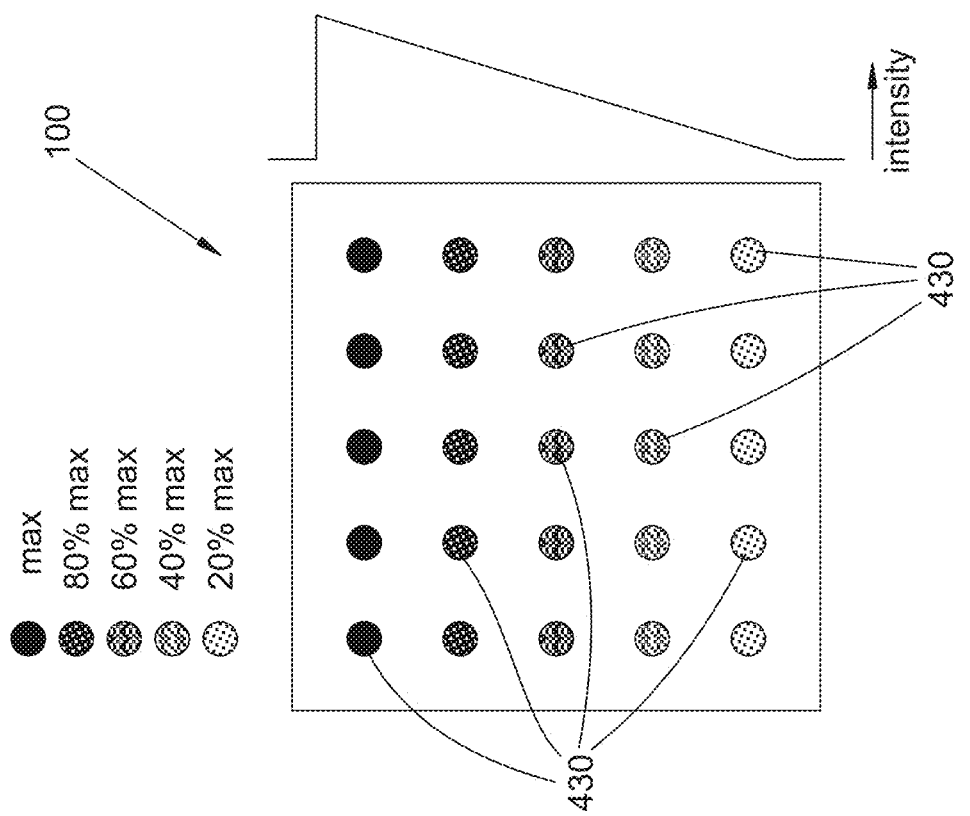
FIG. 16B
FIG. 16A

LIGHT-EMITTING DEVICE WITH CONFIGURABLE SPATIAL DISTRIBUTION OF EMISSION INTENSITY

BENEFIT CLAIMS TO RELATED APPLICATIONS

This application is a continuation-in-part of U.S. non-provisional application Ser. No. 16/875,237 entitled "Light-emitting device with configurable spatial distribution of emission intensity" filed 15 May 2020 in the names of Toni Lopez and Floris Crompvoets, said application being incorporated by reference as if set forth herein in its entirety.

FIELD OF THE INVENTION

The invention relates generally to light-emitting diodes and to phosphor-converted light-emitting diodes.

BACKGROUND

Semiconductor light-emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a different, typically longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, camera flash sources, or flashlights (i.e., torches). An array having one or several or many individual devices per millimeter (e.g., device pitch of about a millimeter, a few hundred microns, or less than 100 microns, and spacing between adjacent devices less than 100 microns or only a few tens of microns or less) typically is referred to as a miniLED array or a microLED array (alternatively, a pLED array). Such mini- or microLED arrays can in many instances also include phosphor converters as described above; such arrays can be referred to as pc-miniLED or pc-microLED arrays.

SUMMARY

An inventive semiconductor light-emitting device (LED) includes first and second doped semiconductor layers, first and second sets of electrically conductive contacts, an array of multiple electrically conductive vias, and a set of electrical traces or interconnects. The first and second doped semiconductor layers are arranged for emitting light resulting from carrier recombination at a junction between them. The first set of contacts includes multiple independent electrically conductive contacts each electrically connected to the first doped semiconductor layer; the second set of contacts includes one or more electrically conductive contacts each electrically connected to the second doped semiconductor layer. The array of multiple electrically conductive vias is arranged across the device and connects contacts of the first set to the first doped semiconductor layer. Each via connects at most one corresponding contact of the first set to the first doped semiconductor layer that is different from a corresponding contact of the first set connected to at least one other via. Each via provides a corresponding discrete, localized, circumscribed electrical connection between the first doped semiconductor layer and the corresponding contact of the first set. The set of multiple independent electrically conductive traces or interconnects connected to the first set of contacts; each contact of the first set is connected to a single corresponding one of the traces or interconnects that is different from a corresponding trace or interconnect connected to at least one other contact of the first set. A set of multiple such devices can be employed arranged as an array.

In some examples, the first doped semiconductor layer is between the first set of contacts and the second doped semiconductor layer, and the device includes an electrically insulating layer between the first doped semiconductor layer and the first set of contacts. In such examples the vias connect contacts of the first set to the first doped semiconductor layer through the insulating layer. In some other examples, the second doped semiconductor layer is between the first set of contacts and the first doped semiconductor layer, and the device includes an electrically insulating layer between the second doped semiconductor layer and the first set of contacts. In such examples the vias connect contacts of the first set to the first doped semiconductor layer through the insulating layer and the second doped semiconductor layer, and are electrically insulated from the second doped semiconductor layer.

The inventive light-emitting device can further include a drive circuit connected to the first and second sets of contacts by the electrically conductive traces or interconnects. The drive circuit can provide electrical drive current that flows through the device and causes the device to emit light, with corresponding portions of the electrical drive current flowing through one or more vias of the array as corresponding via currents. Each via current magnitude can differ from at least one other via current magnitude. The drive circuit can provide one or more specified spatial distributions across the device of the via current magnitudes provided to the corresponding vias of the array. In such examples the spatial distribution of light emission intensity varies across the device according to the arrangement of the array of vias across the device and the specified distribution among the vias of the array of the via current magnitudes provided by the drive circuit.

Another inventive light-emitting apparatus includes n-doped and p-doped semiconductor layers, first and second sets of electrically conductive contacts, and an array of multiple electrically conductive vias. The n-doped and p-doped semiconductor layers are arranged for emitting light resulting from carrier recombination at a junction between them. The first set of contacts includes one or more electrically conductive contacts each electrically connected to the p-doped semiconductor layer; the second set contacts includes one or more electrically conductive contacts each electrically connected to the n-doped semiconductor layer. The array of multiple electrically conductive vias is arranged across the device and connects contacts of the first set to the p-doped semiconductor layer. Each via provides a corresponding discrete, localized, circumscribed electrical connection between the p-doped semiconductor layer and the corresponding contact of the first set. The array of vias is arranged across the device so that one or both of via local number density or via transverse area varies according to position across the device and results in a corresponding spatial distribution of light emission intensity that varies across the device according to the arrangement of the array of vias.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 3A shows a schematic cross-sectional view of an example array of pcLEDs arranged with respect to waveguides and a projection lens. FIG. 3B shows an arrangement similar to that of FIG. 3A, but without the waveguides.

FIG. 4C is a side cross-sectional schematic diagram of an example of a close-packed array of multi-colored phosphor-converted LEDS on a monolithic die and substrate.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

FIG. 7 shows a schematic diagram of an example of three differently scaled images of an example array of four light-emitting devices, and a corresponding intensity distribution of the image; the images are formed in a Fourier plane.

FIG. 8 shows uniform and sloped output intensity distributions for a single light-emitting device.

FIG. 13A is an example of a via size distribution for producing a sloped emission intensity distribution using the examples of FIGS. 12A or 12B. FIG. 13B is an example of via number density distribution for producing a sloped emission intensity distribution using the examples of FIGS. 12A or 12B.

FIGS. 16A and 16B are examples of via current magnitude distributions for producing a sloped emission intensity distribution using any of the examples of FIGS. 14A-14D or 15A-15D.

Figure 4A:
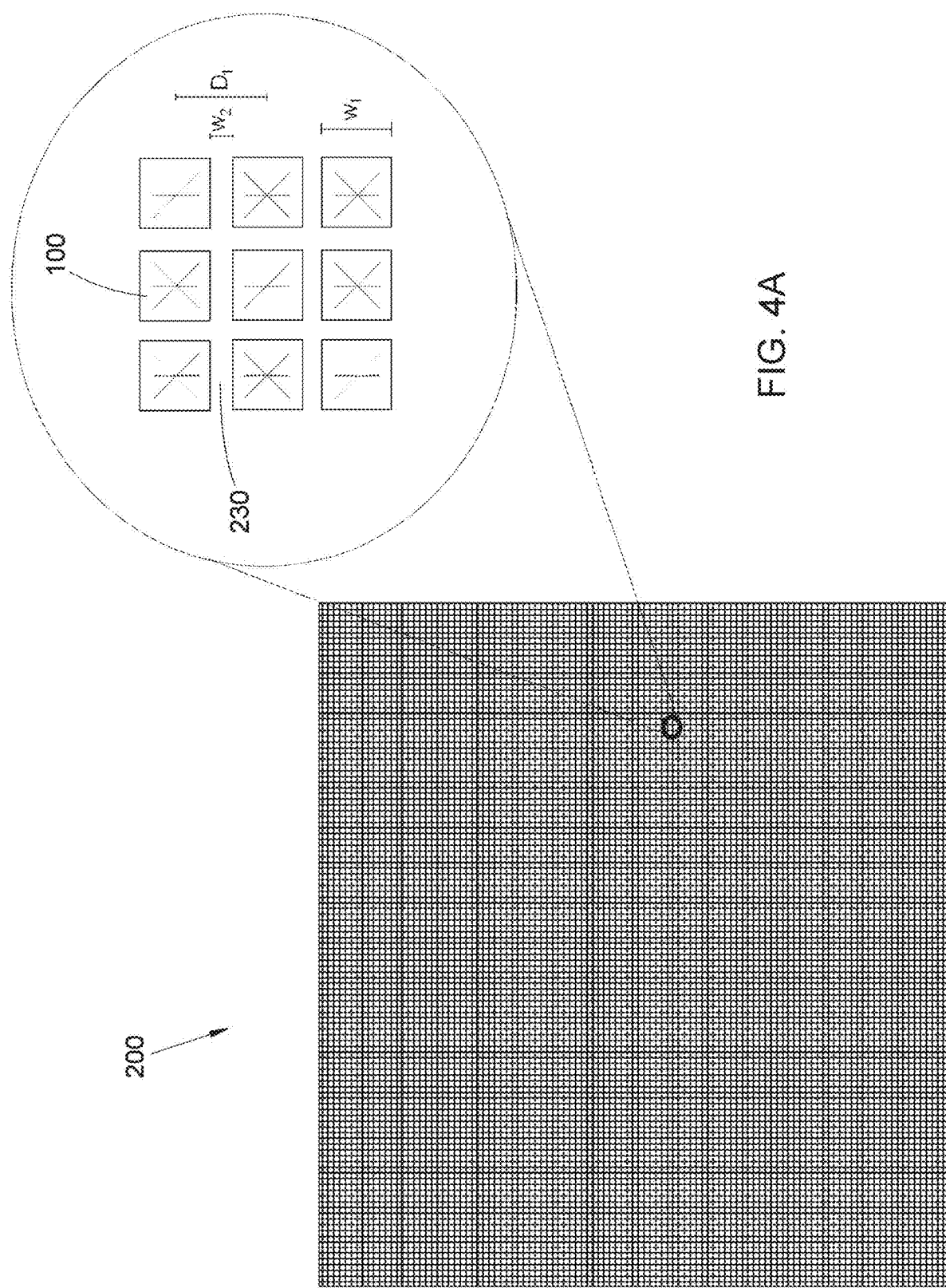
FIG. 4A shows a top schematic view of an example miniLED or microLED array and an enlarged section of 3×3 LEDs of the array.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. Any units or scales of any graphs or plots are arbitrary unless specifically indicated otherwise. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the invention. The detailed description illustrates by way of example, not by way of limitation, the principles of the invention.

FIG. 1 shows an example of an individual pcLED 100 comprising a semiconductor diode structure 102 disposed on a substrate 104, together considered herein an "LED" or "semiconductor LED", and a wavelength converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Suitable material systems may include, for example, various III-Nitride materials, various III-Phosphide materials, various III-Arsenide materials, and various II-VI materials.

Any suitable phosphor materials may be used for or incorporated into the wavelength converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 204 may optionally include electrical traces or interconnects, or CMOS or other circuitry for driving the LED, and may be formed from any suitable materials.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications. A miniLED or microLED display application may use similar optical arrangements to those depicted in FIGS. 3A and 3B, for example. Generally, any suitable arrangement of optical elements may be used in combination with the pcLEDs described herein, depending on the desired application.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch Di is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
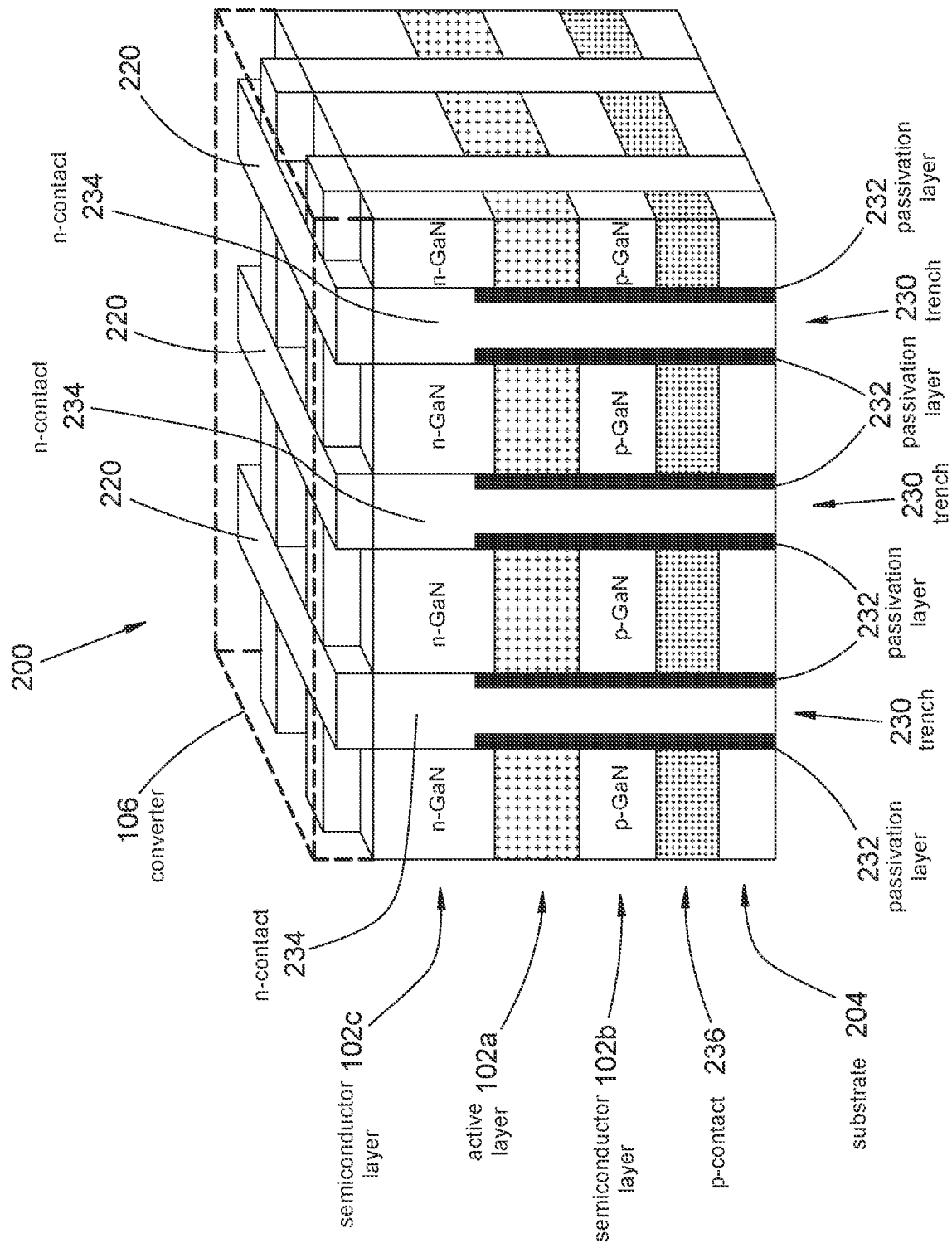
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength converter material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light-emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light-emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Employed in a vehicular headlight, headlight optics (in many instances reflective) are usually adapted to transform light emitted from one or more lighting devices 100 by superimposing multiple images of the one or more lighting devices within a corresponding Fourier plane. FIG. 7 shows an example where three images 299 ("1", "2" and "3") of a row including four light-emitting devices 100 are superimposed by suitable imaging optics in the Fourier plane defined by the headlight optics. For illustrative purpose, images of the light-emitting devices 100 are shown scaled in accordance with a corresponding magnification of the corresponding optics on top of an example image intensity distribution 690 within the Fourier plane. In the figure, regions of the image intensity distribution 690 are indicated with decreasing intensity from region 601 to region 604 (a magnitude of corresponding intensity indicated by a density of black dots in the figure). FIG. 8 shows examples of device output intensity distributions that can be employed in the arrangement of FIG. 7. The example distribution on the left is a substantially uniform distribution across each light-emitting device 100. Using devices 100 with uniform output distributions in the arrangement of FIG. 7 results in an imaged illumination intensity (as a function of vertical angle) substantially as shown schematically in FIG. 9. The example distribution on the right in FIG. 8 is a so-called sloped distribution 199, having a maximum near one edge of the device 100 and decreasing monotonically toward the opposite edge.

Figure 9:
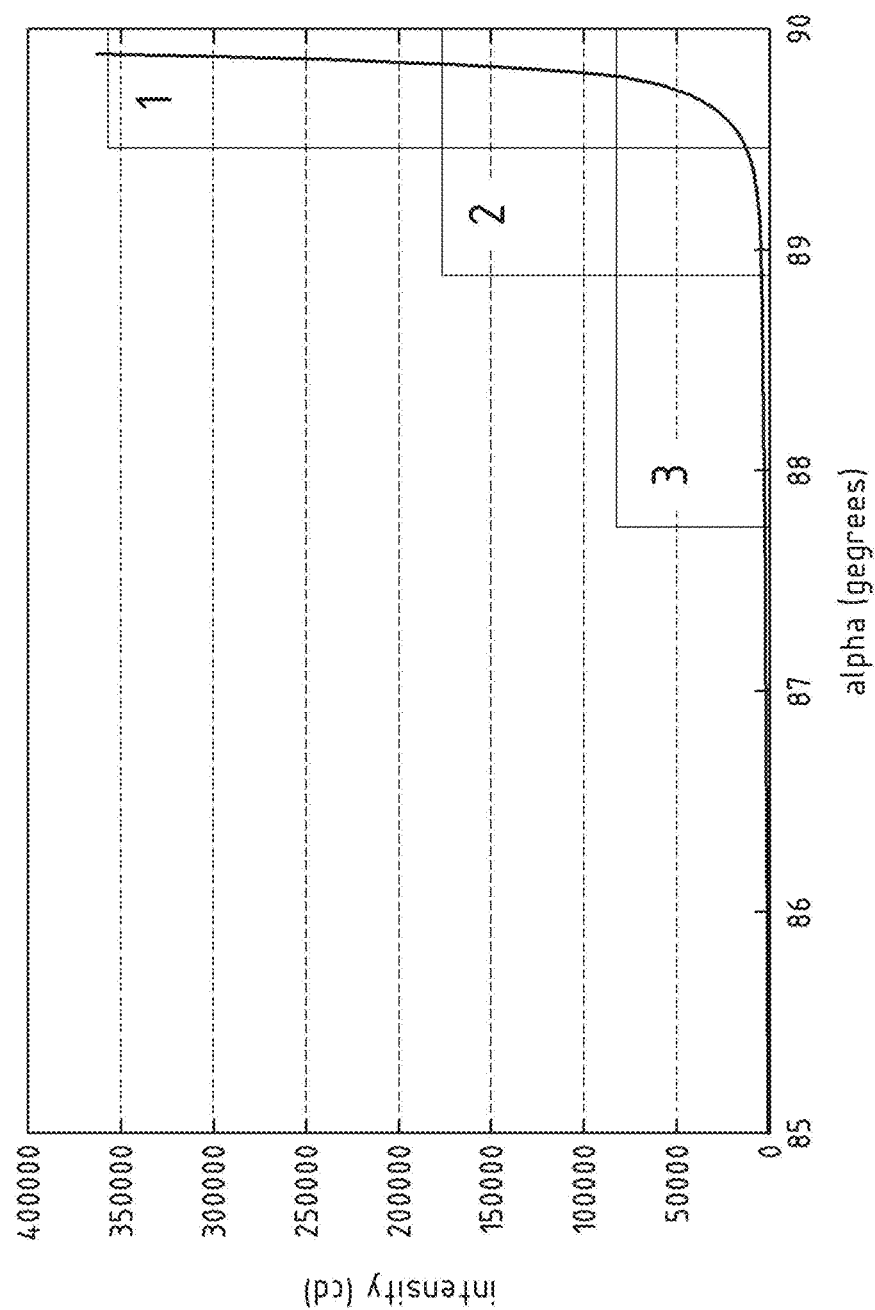
FIG. 9 shows a schematic plot of imaged illumination intensity as a function of vertical angle for an array of light-emitting devices, having uniform output intensity distributions, imaged as in FIG. 7.

A desirable light source for a vehicular headlight should enable light imaged by the headlight optics (i.e., an intensity profile formed within a Fourier plane defined by the optics) to be concentrated along a single direction with only little intensity emitted in other directions to avoid disturbing oncoming traffic. Such directionality in accordance with an angular distribution as shown in FIG. 9 can advantageously be achieved by inventive light-emitting devices disclosed or claimed herein.

Figure 10A:
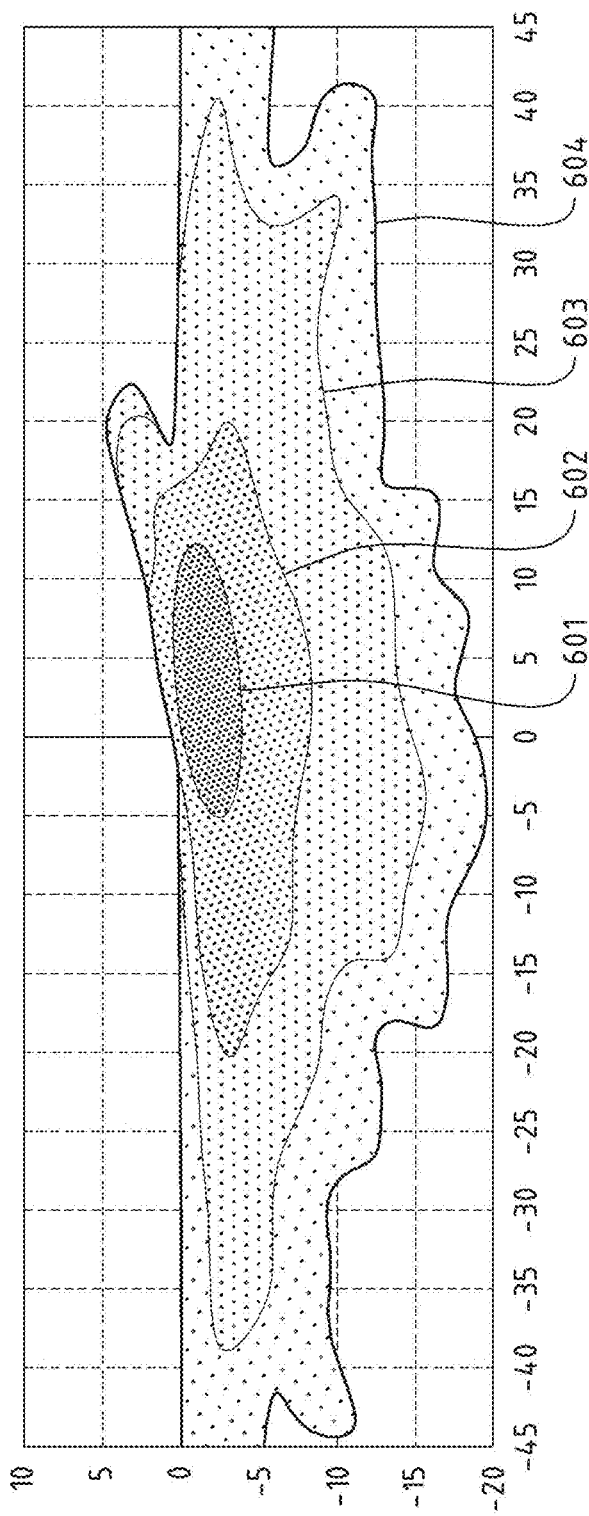
FIG. 10A shows an example image intensity distribution within a Fourier plane of an array of light-emitting devices having the output intensity distribution shown in FIG. 10B when imaged as in FIG. 7.
Figure 10B:
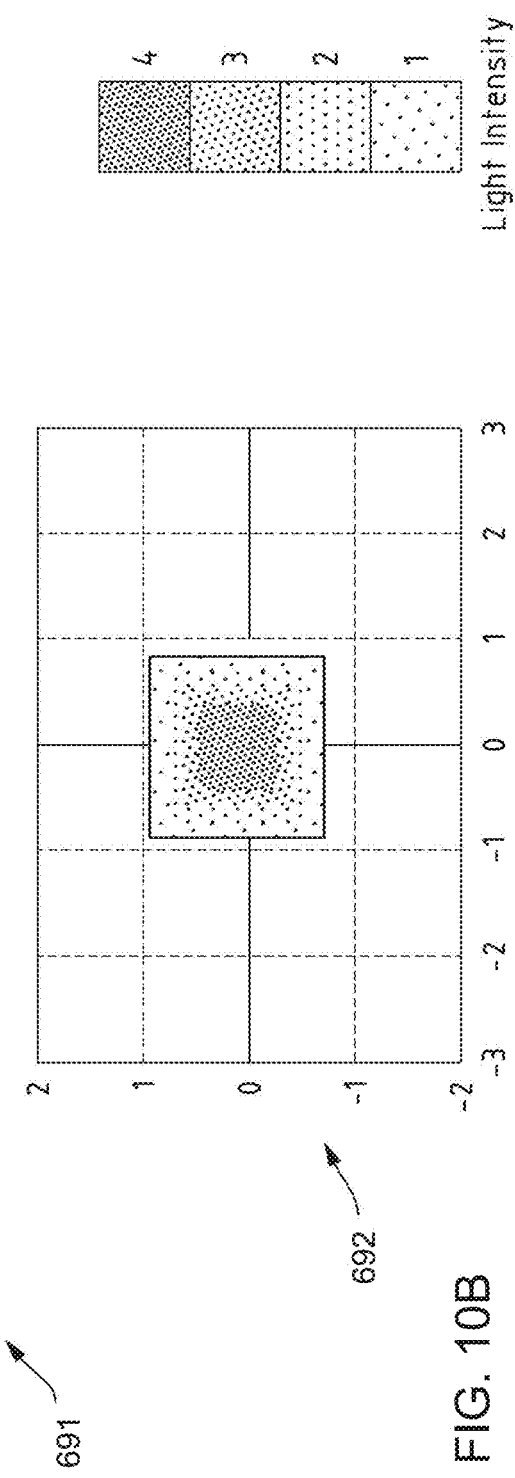
Figure 11A:
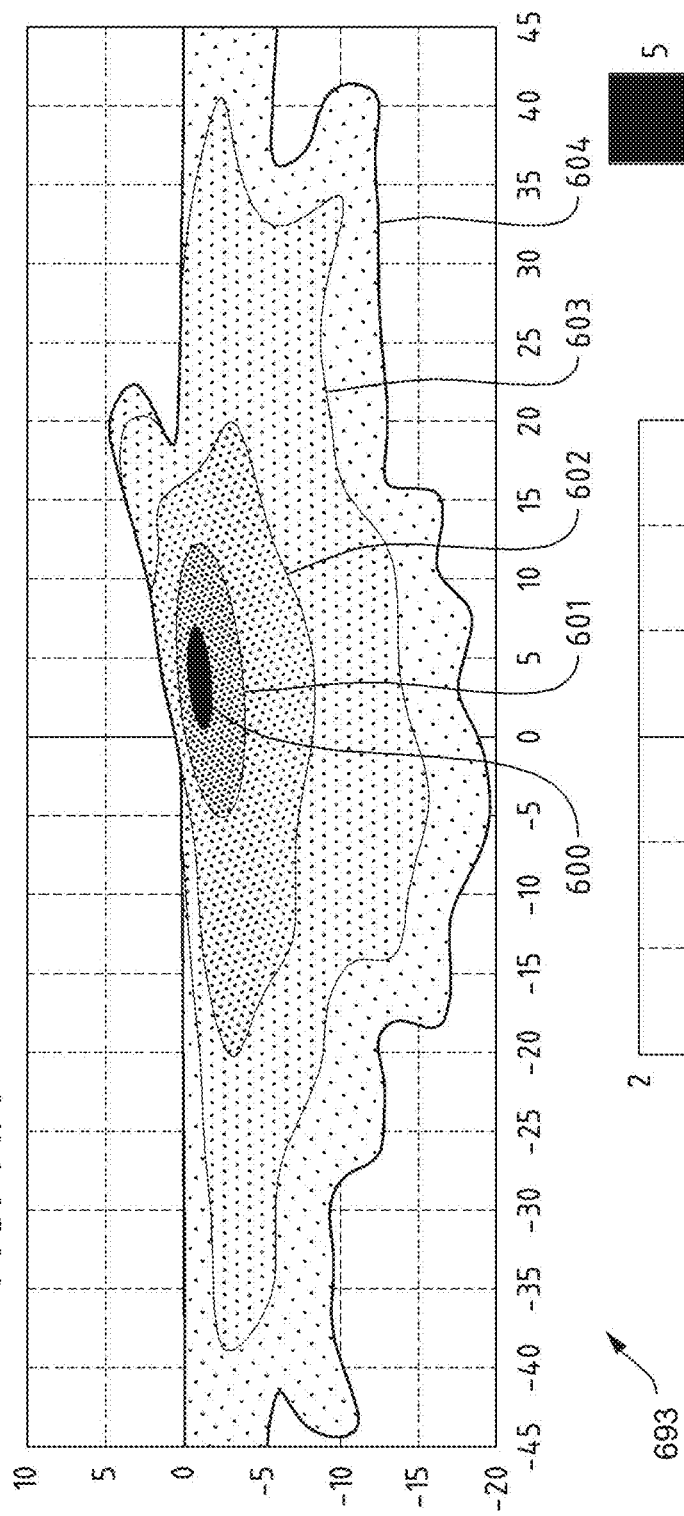
FIG. 11A shows an example image intensity distribution within a Fourier plane of an array of light-emitting devices having the output intensity distribution shown in FIG. 11B when imaged as in FIG. 7.
Figure 11B:
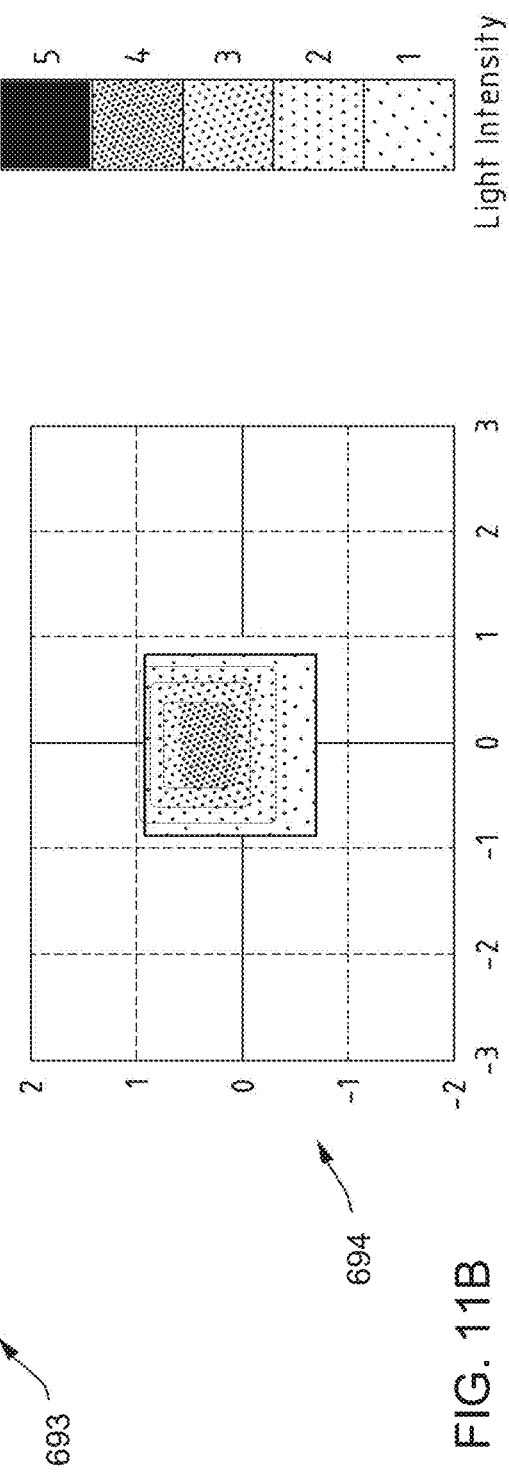

FIG. 10A is an imaged intensity distribution 691 (with contour lines 601/602/603/604) arising from a row of four light-emitting devices 100 imaged according to the arrangement of FIG. 7; each device 100 has the output intensity distribution 692 shown in FIG. 10B (similar to the left-hand distribution of FIG. 8). FIG. 11A is an imaged intensity distribution 693 (with contour lines 600/601/602/603/604) arising from a row of four light-emitting devices 100 imaged according to the arrangement of FIG. 7; each device 100 has the output intensity distribution 694 shown in FIG. 11B (similar to the right-hand distribution of FIG. 8). The imaged distribution 693 of FIG. 11A is more strongly peaked along the desired direction than the distribution 691 of FIG. 10A. Therefore it may be desirable in some instances to providing light sources 100 that can provide an output distribution similar to that of FIG. 11B that is more concentrated towards an upper edge while avoiding disturbing upwardly projecting beams and disturbing sidewards projecting beams (as is discussed further below).

Thus, it is desirable in certain illumination applications (e.g., certain automotive headlight assemblies that include reflective optics) to employ semiconductor light-emitting devices (LEDs) that exhibit a specified spatial distribution of emission intensity. As described above, some low-beam automotive headlights have been observed to exhibit desirable beam intensity profiles when employing LEDs with an intensity distribution having a maximum near one edge of the device and decreasing monotonically toward the opposite edge of the device (referred to herein as a sloped intensity distribution). In another example, some high-beam automotive headlights are observed to exhibit desirable beam intensity profiles when employing LEDs with an intensity distribution having a maximum in a central region of the device and decreasing toward the edges of the device (referred to herein as a 2D-peaked intensity distribution). Other intensity distributions can be advantageously employed in other use applications, including automotive and non-automotive applications.

Several examples of LEDs have been disclosed previously that can produce specified intensity distributions. Some of those are disclosed in:

EP 3 182 451 published 21 Jun. 2017 in the name of Stanley Electric Co Ltd;
EP 2 584 618 published 24 Apr. 2013 in the name of Stanley Electric Co Ltd;
US 2012/0051075 published 1 Mar. 2012 in the name of Harada;

US 2012/0051079 published 1 Mar. 2012 in the name of Saito; and

US 2017/0210277 published 27 Jul. 2017 in the name of Harada.

In some of those conventional examples, a so-called flip-chip LED 10 can be employed having p- and n-contacts 14 and 15 connected to p- and n-doped layers 13 and 11, respectively, and connected to a drive circuit 302 by traces or interconnects 238. Current from the drive circuit 20 flows through the contacts 12/14, and light is emitted from the p-n junction (including active layer 12) and exits through the n-doped layer 11 of the device 10; the general arrangement is shown in the schematic cross-sectional view of FIG. 12A. The layer 11/12/13 constitute the semiconductor diode portion 102 of the device 10. The metal p-contact 14 acts as an optical reflector. The n-contact 15 is separated from the p-contact 14 by an insulating layer 18. Multiple conductive vias 16 connect the n-contact 15 to the n-doped layer 11 of the device 10 through the insulating layer 18, the p-contact 14, and the p-doped layer 13. The vias 16 that connect to the n-doped layer 11 through the p-doped layer 13 are often referred to as n-vias. The vias 16 are electrically insulated from the p-contact 14 and the p-doped layer 13. To achieve a desired spatial distribution of emission intensity, the sizes and/or local number density of the vias 16 can vary with transverse position across the device 10, resulting in carrier recombination density through the device that varies with transverse position (e.g., higher local number density (equivalently, smaller via spacing) or larger size of vias 16 resulting in higher local carrier recombination density). That position-dependent carrier recombination density in turn yields a position-dependent emission intensity.

Figure 12A:
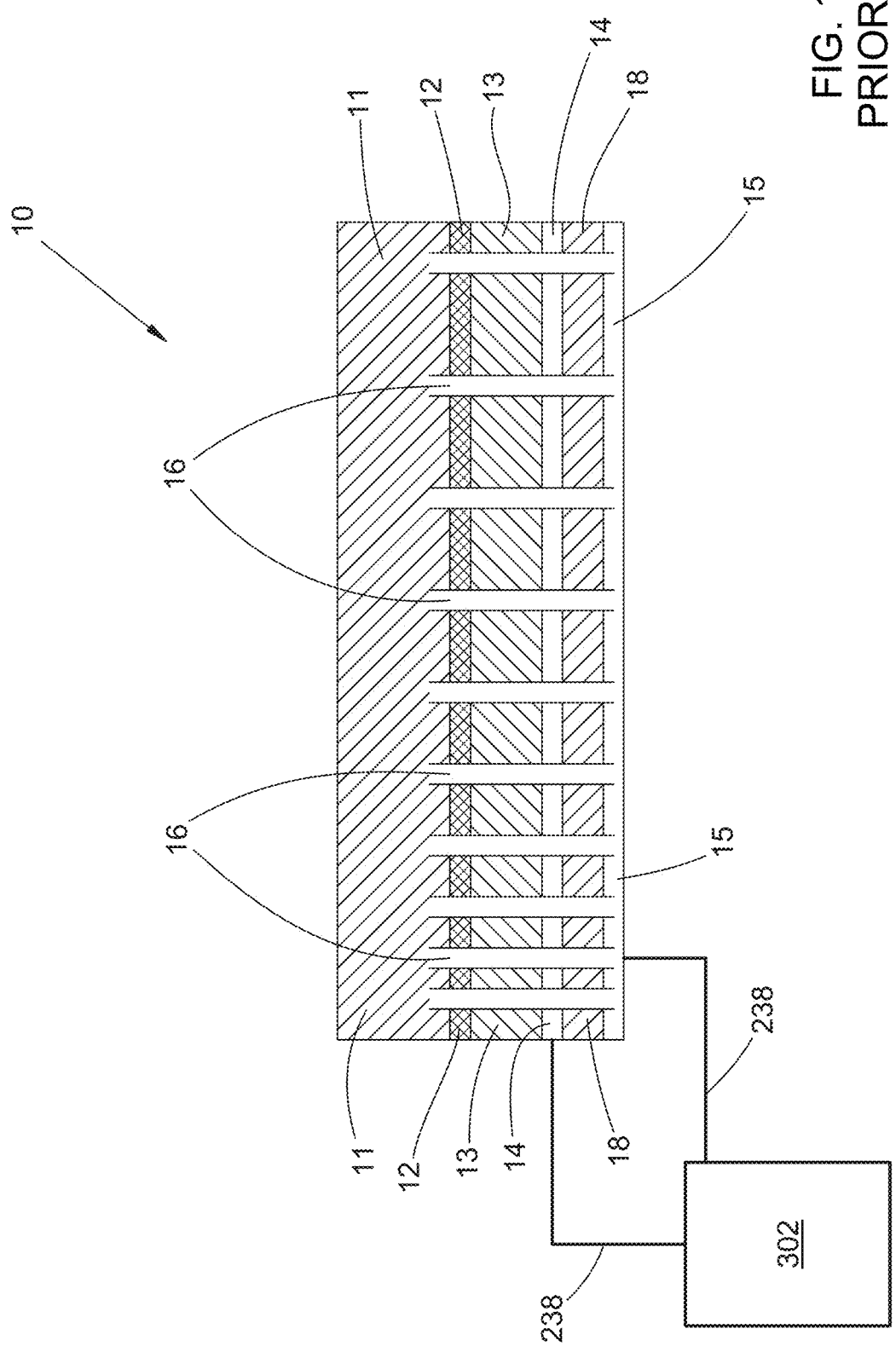
FIG. 12A is a schematic side cross-sectional view of an example of a conventional light-emitting device.
Figure 12B:
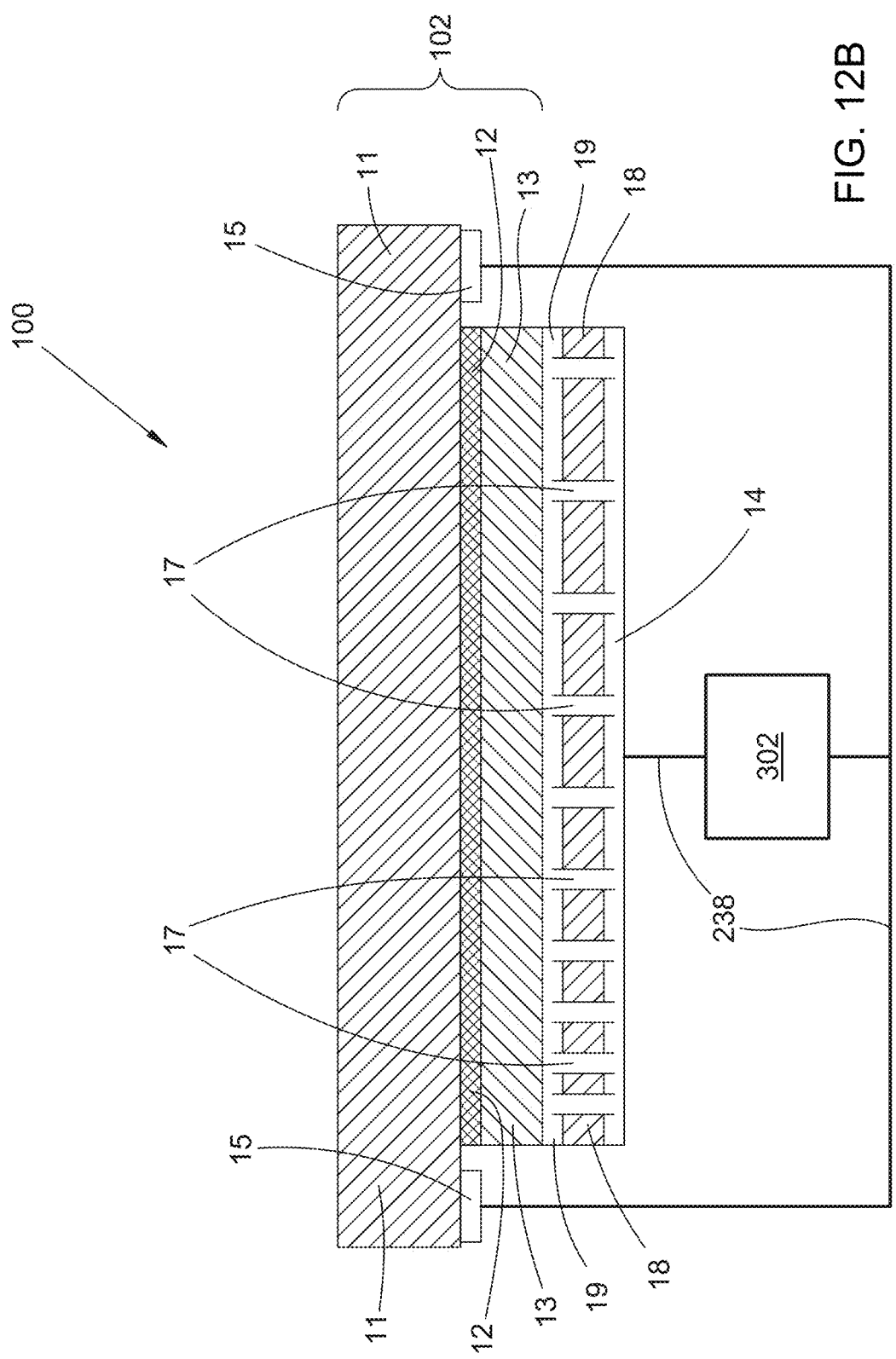
FIG. 12B is a schematic side cross-sectional view of an example arrangement of an inventive light-emitting device.

An inventive light-emitting device 100 is illustrated schematically in FIG. 12B, and includes p-doped and n-doped semiconductor layers 13 and 11, respectively, a first set of electrical conductive contacts 14, a second set of electrical conductive contacts 15, and an array of electrically conductive vias 17 (substrate 104 and phosphor 106 omitted for clarity; the arrangement shown can be implemented in a light-emitting device that lacks a wavelength converting phosphor 106; such an implementation falls within the scope of the present disclosure). The p-doped and n-doped semiconductor layers 13 and 11 are arranged as a semiconductor diode structure 102 for emitting light resulting from carrier recombination at a junction between them. The junction can be of any type or arrangement suitable for generating light in response to current passing through the device 100 under forward-biased conditions. In some examples the junction can include an active layer 12 including one or more active semiconductor layers or one or more quantum wells. Any one or more suitable semiconductor materials can be employed for the p-doped semiconductor layer 13, the n-doped semiconductor layer 11, and the active layer 12. In many examples one or more doped III-V semiconductor materials or alloys thereof are employed to form the semiconductor layers 11/12/13. In many examples that include one or more active layers or quantum wells, those can include one or more doped or undoped III-V semiconductor materials or alloys thereof.

The first set of contacts 14 includes one or more electrically conductive contacts 14 each electrically connected to the p-doped semiconductor layer 13; if multiple contacts 14 are present they are directly coupled or operated as if they were, and so shall be referred to in the singular. The second set of contacts 15 includes one or more electrically conductive contacts 15 each electrically connected to the n-doped semiconductor layer 11; if multiple contacts 15 are present they are directly coupled or operated as if they were, and so shall be referred to in the singular. The array of vias 17 includes multiple electrically conductive vias 17 arranged across the device 100. The vias 17 of the array connect the contact 14 to the p-doped semiconductor layer 13, with each via 17 providing a corresponding discrete, localized, circumscribed electrical connection between the p-doped semiconductor layer 13 and the contact 14. The contacts 14/15 and the vias 17 can include any one or more suitable electrically conductive materials; metals typically can be employed. The array of vias 17 is arranged across the device 100 so that one or both of via local number density (equivalently, via spacing) or via transverse area varies according to position across the device 100 (e.g., variation of via transverse area in FIG. 13A, and variation of via local number density in FIG. 13B). That variation in turn results in a corresponding spatial distribution of light emission intensity that varies across the device 100 according to the arrangement of the array of vias 17. The device 100 can further include an electrically insulating layer 18 between the p-doped semiconductor layer 13 and the contact 14, wherein the vias 17 connect the contact 14 to the p-doped semiconductor layer 13 through the insulating layer 18. The insulating layer 18 can include any one or more suitable materials; doped or undoped silica is often employed.

Any suitable arrangement can be employed for variation of the sizes or spacings of the vias 17. In one example, substantially identical vias 17 can be employed arranged with smaller spacings between them in area where higher emission intensity is desired, and with larger spacings between them in areas where lower emission intensity is desired (e.g., as in FIG. 13B). In another example, the vias 17 can be positioned according to a regular grid pattern, with vias having larger diameters positioned in regions where higher emission intensity is desired and vias having smaller diameters positioned in regions where lower emission intensity is desired (e.g., as in FIG. 13A; fractions refer to a fraction of maximum via area). Suitable combinations of varying sizes and spacings can be advantageously employed. Any suitable emission intensity distribution can be selected including any of those described above (e.g., sloped, 1D-peaked, or 2D-peaked; sloped shown in FIGS. 13A and 13B).

In some examples the contact 14 can include one or more metals or metal alloys, and the contact 14 and the insulating layer 18 can be arranged so as to act as a composite optical reflector for light emitted by the device 100. In some examples the device 100 includes an electrode layer 19 between the p-doped semiconductor layer 13 and the insulating layer 18; the electrode layer 19 is in direct contact with the p-doped semiconductor layer 13. The electrode layer 19 is substantially transparent for light emitted by the device 100, and the vias 17 connect the p-doped semiconductor layer 13 to the contact 14 by connecting the electrode layer 19 to the contact 14 (i.e., vias 17 arranged as e-vias in this example). Any suitable electrode material can be employed; in some examples the electrode material includes indium tin oxide (ITO) or indium zinc oxide (IZO).

In addition to the vias 17 connected to the contact 14, in some examples the contact 14 can include one or more edge contacts positioned about the periphery of the device 100 (not shown). In some examples, the contact 15 can include one or more edge contacts 15 positioned about the periphery of the device 100 (not shown), or can include one or more areal contacts 15 on the same side of the device 100 as the contact 14 (e.g., as in FIG. 12B) or on the opposite side of the device 100 (not shown). Additional conductive or insulating layers that might be employed for establishing connections among the doped semiconductor layers 11/13, the contacts 14/15, or the drive circuit 302 are omitted from the drawings for clarity. In some examples, the device 100 can include a second array of multiple electrically conductive vias (not shown) arranged across the device 100. In such examples the vias of that second array can connect the contact 15 to the second doped semiconductor layer 11, and each such via provides a corresponding discrete, localized, circumscribed electrical connections between the n-doped semiconductor layer 11 and the contact 15. In some such examples, the sizes or spacings of the vias of the second array can vary across the device 100 in a manner similar to such variations of the vias 14 of the first array described above.

While useful, the arrangements of FIGS. 12A and 12B can have a number of drawbacks. First, structural features formed by spatially selective material processing techniques (e.g., epitaxy or lithography) can become less reproducible or reliable as feature sizes decrease (e.g., as vias get smaller to reduce local carrier recombination density or spacing between them gets smaller to increase local carrier recombination density). For example, that can limit a practicably achievable dynamic range of light emission intensity that can be realized across the device. Second, once fabricated, the spatial distribution of light emission of a given device is fixed. If multiple different emission distributions are desired, multiple corresponding light-emitting devices must be provided, with each one producing only one of the desired emission distributions. That leads to inefficiencies of two types. A device manufacturer must fabricate and inventory multiple different types of light-emitting devices to cover different desirable emission distributions. A device user that requires multiple different emission distributions in a single apparatus (e.g., for both low and high beams in an automotive headlight) must design that apparatus to include multiple light-emitting devices, driving up cost and complexity of the apparatus. Therefore it would be desirable to provide a light-emitting device that can provide multiple different spatial emission distributions.

Examples of inventive semiconductor light-emitting devices 100 (LEDs) are illustrated schematically in FIGS. 14A-14D and 15A-15D. The substrate 104 and phosphor 106 are omitted for clarity. The arrangements shown can also be implemented in a light-emitting device that lacks a wavelength converting phosphor 106; such an implementation falls within the scope of the present disclosure. An inventive semiconductor light-emitting device 100 includes first and second doped semiconductor layers 410 and 419, respectively, a first set of electrically conductive contacts 420, a second set of electrically conductive contacts 429, and an array of electrically conductive vias 430. The first and second doped semiconductor layers 410/419 are arranged as a semiconductor diode structure 102 for emitting light resulting from carrier recombination at a junction between them. The junction can be of any type or arrangement suitable for generating light in response to current passing through the semiconductor diode structure 102 under forward-biased conditions. In some examples the junction can include an active layer 415 comprising, e.g., one or more active semiconductor layers or one or more quantum wells. Any one or more suitable semiconductor materials can be employed for the first doped semiconductor layer 410, the second doped semiconductor layer 419, and the active layer 415. In many examples one or more doped III-V semiconductor materials or alloys thereof can be employed to form the first and second doped semiconductor layers 410/419 or active layer 415. In many examples that include one or more active layers or quantum wells, those can include one or more doped or undoped III-V semiconductor materials or alloys thereof.

The light produced typically is emitted mainly through the doped semiconductor layer 410 or 419 that is farthest from the contacts 420; some emitted light propagates directly from the junction between the doped layers 410/419, while some of the light undergoes one or more reflections within the device 100 before being emitted. The device 100 can include any one or more additional layers, substrates, or structures on its emission side for any one or more suitable purposes as discussed above (e.g., reduction of reflection; wavelength conversion; collimation, focusing, diffusion, scattering, or other redirection of emitted light; and so forth). The device 100 can be a free-standing structure, or can be formed on any suitable solid substrate (in some instances with the substrate on the side of the device 100 opposite the contacts 420, and therefore typically transparent for the emitted light). In some instances the device 100 can include conductive bond pads or other similar structures (not shown) connected to the contacts 420 or 429 and arranged for mounting the device 100 to a circuit board or similar structure that provides traces or interconnections 238 to a drive circuit 302 (described below). Additional conductive or insulating layers that might be employed are omitted from the drawings for clarity.

The first set of contacts 420 includes multiple independent electrically conductive contacts 420 each electrically connected to the first doped semiconductor layer 410. "Independent" contacts are defined herein as being spatially separated from one another so that there is no direct electrical conduction between them or between corresponding independent traces or interconnections 238; any electrical connections between two independent contacts 420 can only occur indirectly, e.g., by both being separately connected to the first doped semiconductor layer 410, to an electrode 450 (described below), or to a drive circuit 302 (described below). The second set of contacts 429 includes one or more electrically conductive contacts 429 each electrically connected to the second doped semiconductor layer 419.

The array of vias 430 includes multiple electrically conductive vias 430 arranged across the device 100. The vias 430 of the array connect the contacts 420 of the first set to the first doped semiconductor layer 410, with each via 430 connecting at most one corresponding contact 420 of the first set to the first doped semiconductor layer 410. Each via 430 provides a corresponding discrete, localized, circumscribed electrical connection between the first doped semiconductor layer 410 and the corresponding contact 420 of the first set. Any suitable electrically conductive material can be employed to form the contacts 420/429 and the vias 430; in many examples, the contacts 420/429 and the vias 430 can include one or more metals or metal alloys.

In some examples, the transverse sizes of the vias 430 can vary among the vias 430, or the local number density of the vias 430 can vary with position across the device 100. Such variation can contribute to achieving a desired light emission spatial distribution (described further below). In some examples, it may be advantageous for the array of vias 430 to be arranged across the device 100 as a substantially regular grid of substantially identical vias 430. A "regular grid" is defined herein as an arrangement in which the vias 430 occupy positions of a repeating unit cell; the unit cells of the regular grid can be of any suitable size or shape (e.g., square, rectangular, triangular, hexagonal), and can include any suitable number of vias 430 per unit cell, provided that the size, shape, and number are constant for all unit cells of the regular grid. One simple example would be a rectangular grid with a one via 430 per unit cell at the center of each rectangle; other suitable grid arrangements can be employed. Using a regular grid of substantially identical vias 430, variations arising from fabrication of differing feature sizes are substantially eliminated: each via 430 has the same transverse dimensions, and is the same distance from its nearest neighbors, as all the other vias 430 of the array. Achieving variation of the emitted light intensity across the device, using identical, uniformly spaced vias 430, is described further below, and relies on the independence of the contacts 420.

An inventive light-emitting device 100 can be of any suitable or desirable transverse dimensions and can include suitable or desirable number of vias 430. Some typical devices can have transverse dimensions from one or several hundred microns to a few millimeters, and can have arrays of vias that include, e.g., 4×4 n-vias up to 10×10 n-vias or more (more generally, nxm where n and m can differ), or 10×10 so-called e-vias (connecting an electrode layer to a p-contact through an insulating layer) up to 50×50 e-vias or more.

Instead of relying solely upon variation among the vias 430, of size or local number density or local spacing, to achieve spatial variation of the emitted light intensity distribution, in the inventive device 100 the independent contacts 420 are employed to provide differing corresponding via currents that flow between the first doped semiconductor layer 410 and the contacts 420 through the vias 430. In some examples, each contact 420 of the first set is connected to at most one corresponding via 430 of the array. Such an arrangement enables individual control over current flowing through each via 430 independent of the currents flowing through the other vias 430, and provides the highest spatial resolution for controlling local carrier recombination density through the device 100 for a given arrangement of the vias 430. In other examples, one or more contacts 420 of the first set can be each connected to multiple corresponding vias 430 of the array. A subset of vias 430 that are attached to the same contact 420 can only be controlled together by altering the total current that flows through the contact 420 and is divided among the vias 430 connected to that contact 420.

FIGS. 14A-14D and 15A-15D illustrate two general example arrangements for an inventive light-emitting device 100. In the example general arrangement shown in FIGS. 14A-14D, the first doped semiconductor layer 410 is between the first set of contacts 420 and the second doped semiconductor layer 419, and an electrically insulating layer 440 is between the first doped semiconductor layer 410 and the first set of contacts 420. The insulating layer 440 can include any one or more suitable materials; in some examples the insulating layer 440 includes doped or undoped silica. The vias 430 connect contacts 420 of the first set to the first doped semiconductor layer 410 through the insulating layer 440. In some examples that are thus arranged, the first doped semiconductor layer 410 can be a p-doped layer and the second doped semiconductor layer 419 can be an n-doped layer. The insulating layer 440 can include any one or more suitable materials; in some examples the insulating layer 440 includes doped or undoped silica. In some examples arranged as in FIGS. 14A-14D, the contacts 420 can be metal contacts, and the contacts 420 and the insulating layer 440 can be arranged so as to act as a composite optical reflector for light emitted by the device 100. The metallic contacts 420 often can be lossy as reflectors; the presence of the insulating layer 440 reflects at least some of the light propagating within the layers 410/419 before reaching the contacts 420, thereby reducing optical loss. In some examples (e.g., as in FIG. 14A), the vias 430 are connected directly to the first doped semiconductor layer 410.

In some examples (e.g., as in FIGS. 14B-14D), an electrode layer 450 is between the first doped semiconductor layer 410 and the insulating layer 440, and is in direct contact with the first doped semiconductor layer 410. The electrode layer 450 is substantially transparent for light emitted by the device 100, and the vias 430 (arranged as e-vias in these examples) connect the first doped semiconductor layer 410 to the contacts 420 by connecting the electrode layer 450 to the contacts 420. The electrode layer 450 can include any one or more suitable materials; in some examples indium tin oxide (ITO) or indium zinc oxide (IZO) can be employed. In some examples (e.g., as in FIG. 14B), the electrode 450 can be a single contiguous layer spanning most or nearly all of the device 100 (except for, e.g., other vias that pass through it, if present).

In other examples (e.g., as in FIGS. 14C and 14D), it can be desirable to arrange the electrode layer 450 as multiple discrete areal segments separated by electrically insulating material, thereby substantially preventing transverse electrical conduction between adjacent areal segments of the electrode layer 450. In some examples that include such an arrangement, each areal segment of the electrode layer 450 can be connected to at most one corresponding contact 420 by one or more corresponding vias 430; in other examples that include such an arrangement, each areal segment of the electrode layer 450 can be connected to multiple different contacts 420 by corresponding vias 430. The segmentation of the electrode layer 450 can enhance the spatial resolution of the carrier recombination spatial distribution provided by the vias 430, by somewhat limiting the transverse movement of charge carriers to or from any given via 430 to the area occupied by the corresponding areal segment of the electrode layer 450.

Figure 14A:
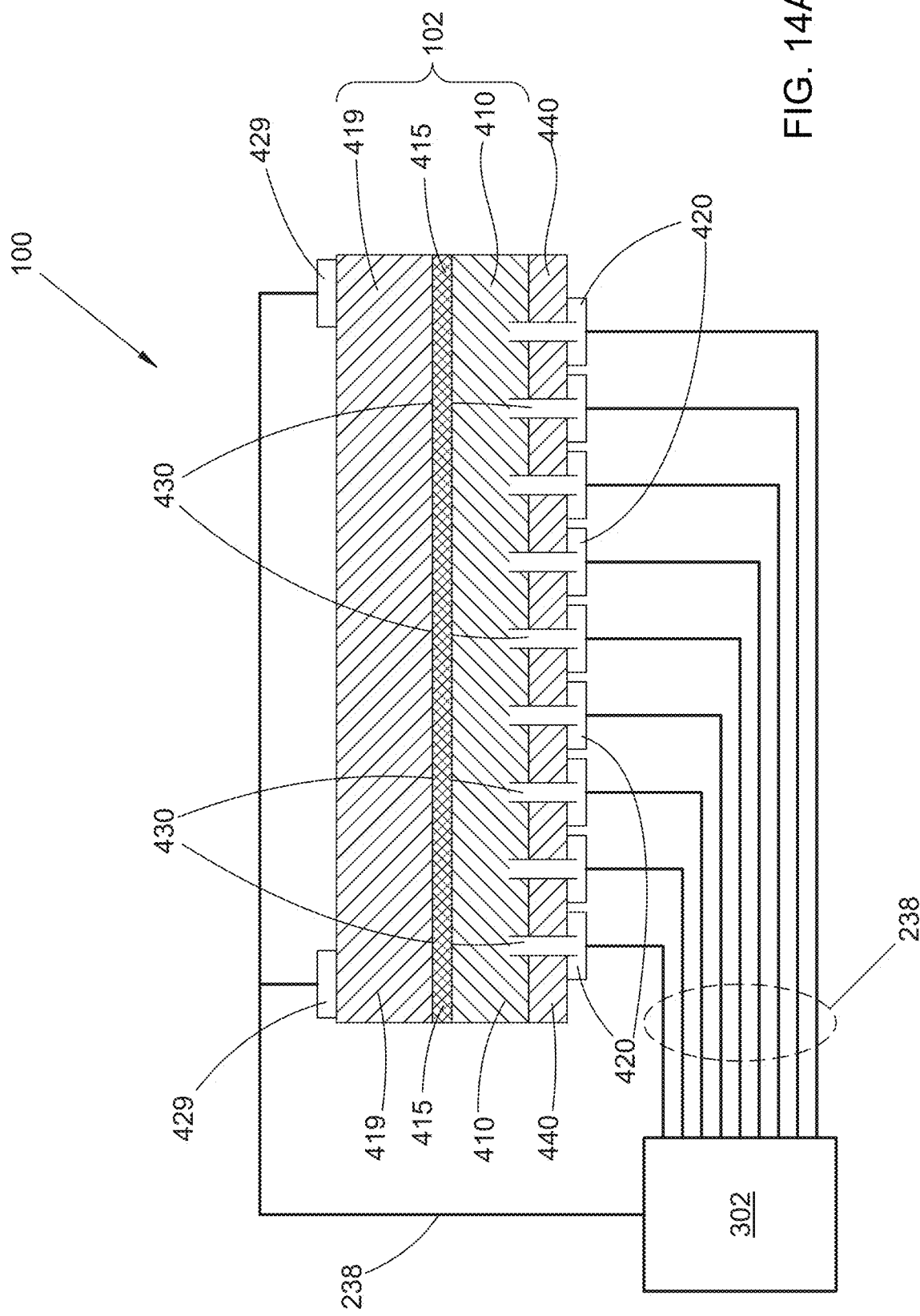
FIGS. 14A through 14D are schematic side cross-sectional views of a first group of example arrangements of an inventive light-emitting device.
Figure 14B:
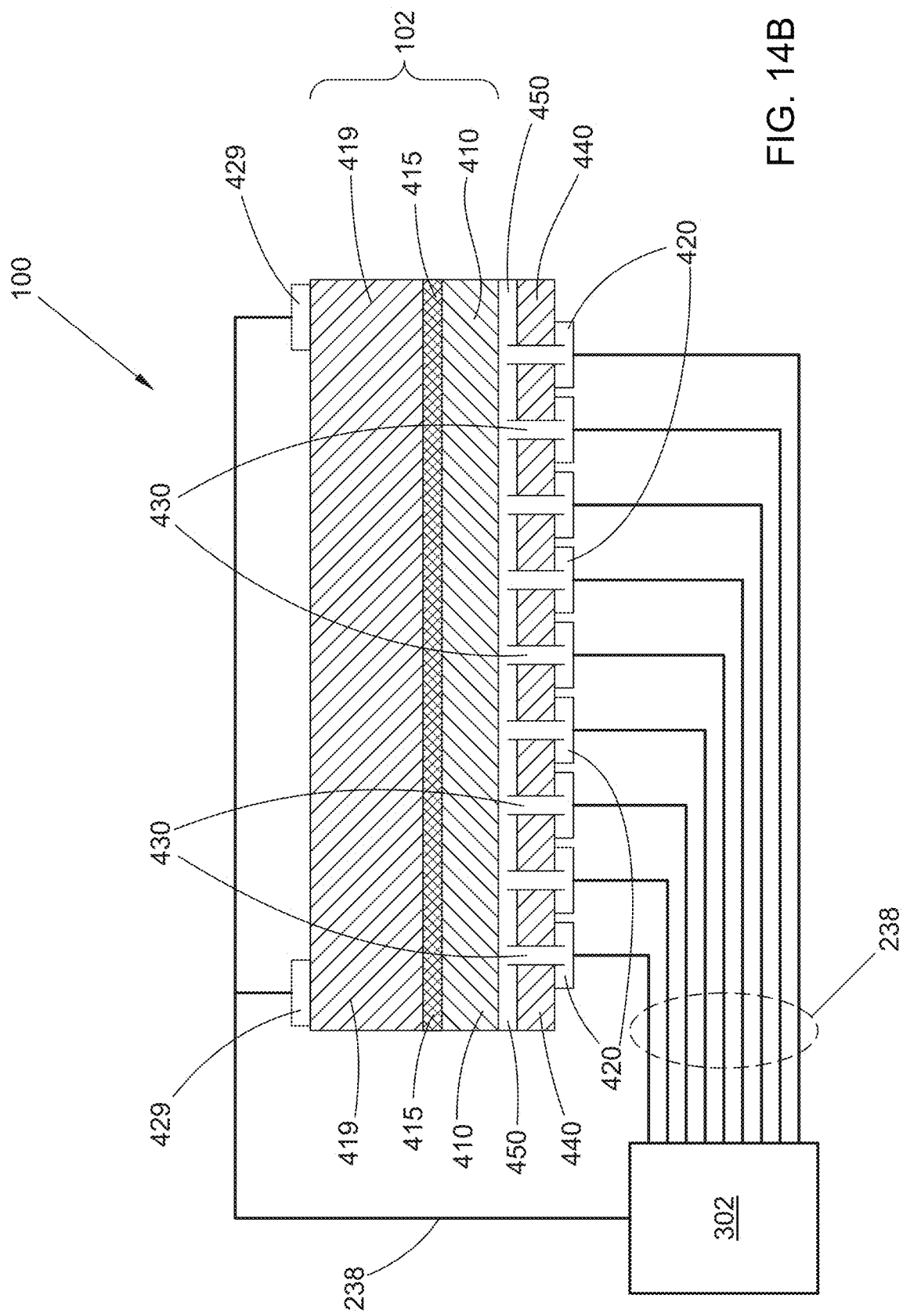
Figure 14C:
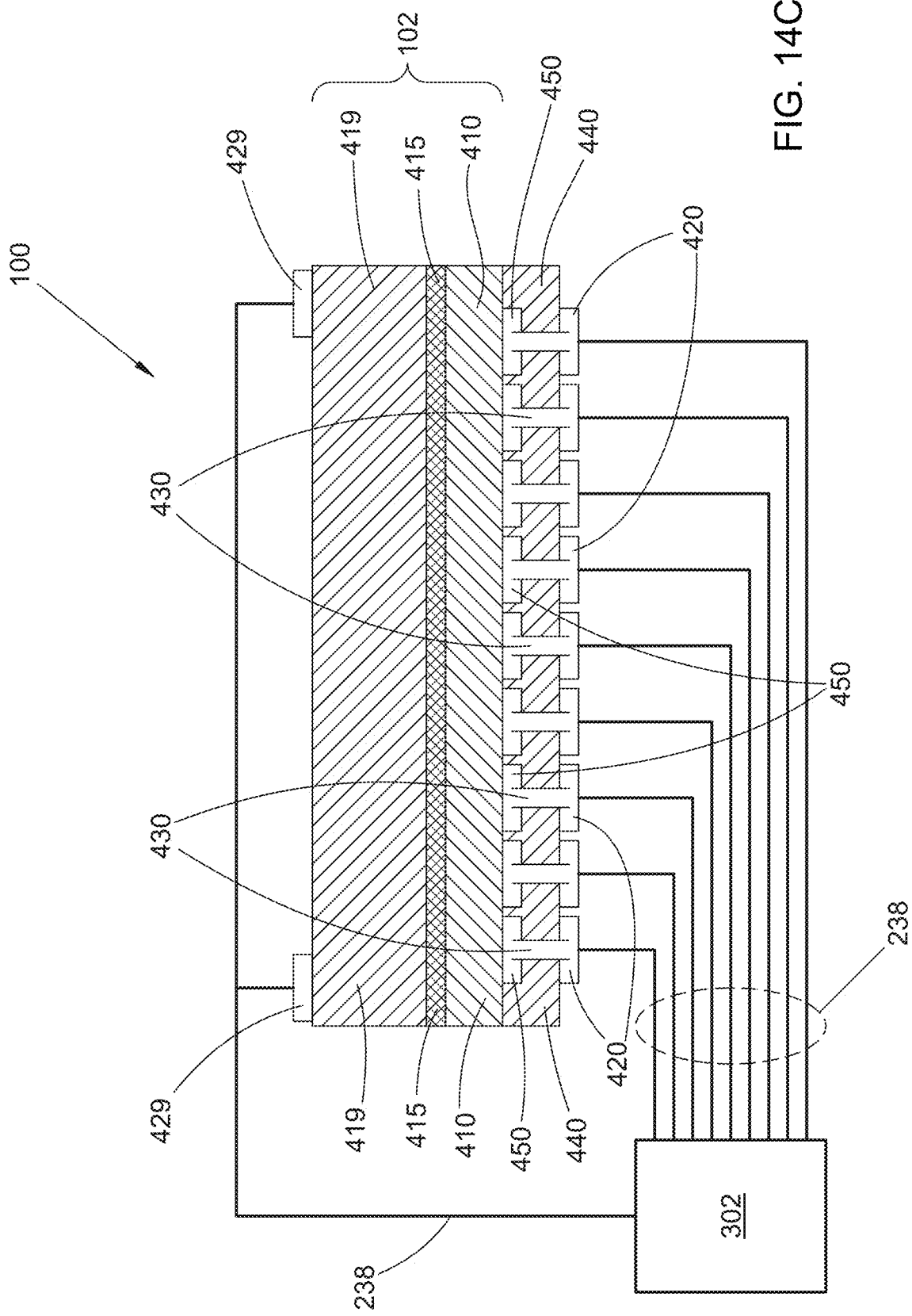
Figure 14D:
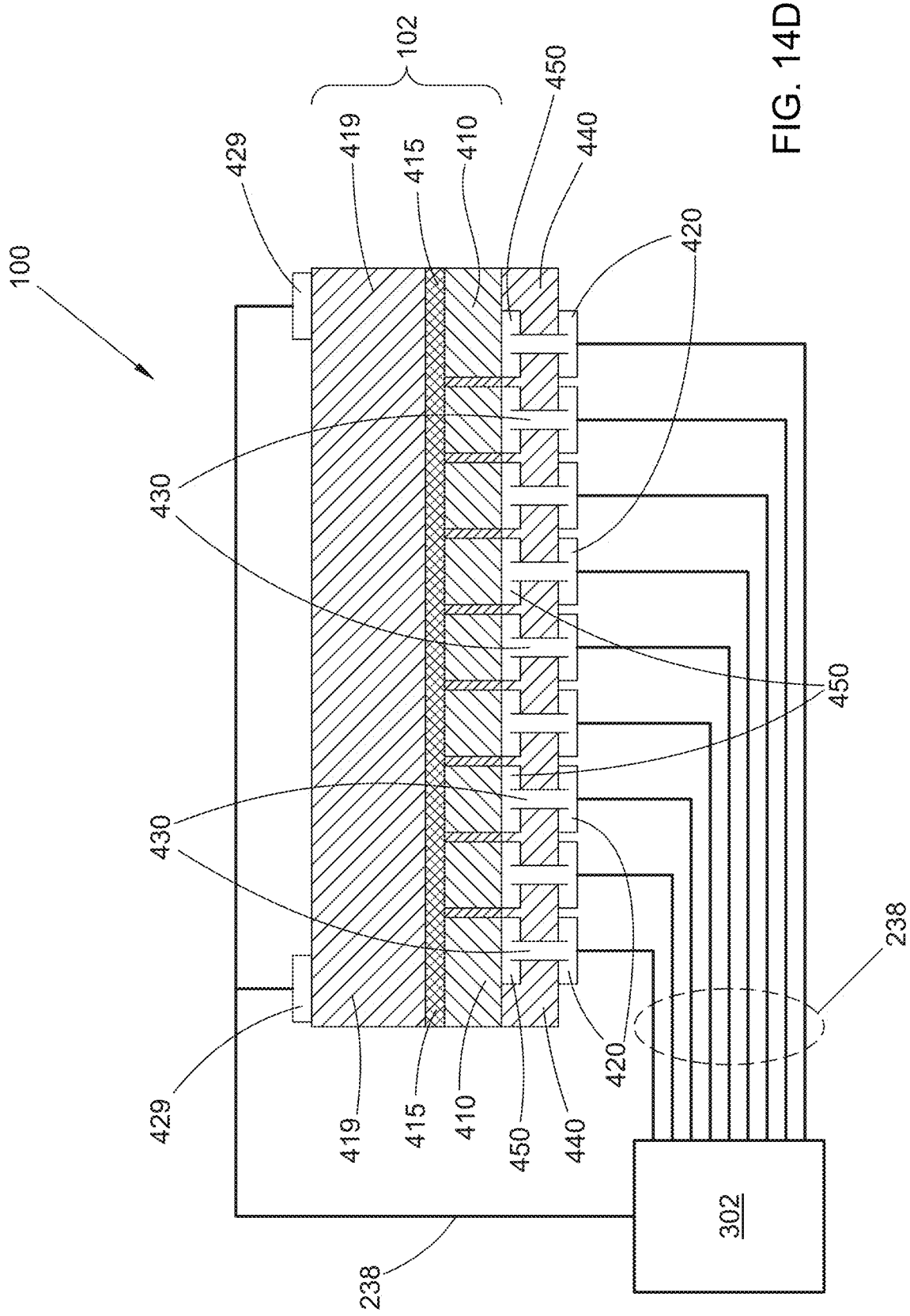

In the examples of FIGS. 14A-14C, the first doped semiconductor 410 can be a single contiguous layer spanning most or nearly all of the device 100. Further enhancement of spatial resolution can be achieved in some examples (e.g., as in FIG. 14D), by division of the first doped semiconductor layer 410 into multiple discrete areal segments separated by electrically insulating material. In such an arrangement movement of charge carriers between a given contact 420 and the junction is confined transversely by insulating material separating the corresponding areal segments of the electrode layer 450 and the first doped semiconductor layer 410 from adjacent segments. If suitable or desirable, in some examples the second doped semiconductor layer 419 can be similarly divided into discrete areal segments (not shown).

In the example general arrangement shown in FIGS. 15A-15D, the second doped semiconductor layer 419 is between the first set of contacts 420 and the first doped semiconductor layer 410, and an electrically insulating layer 440 separates the second doped semiconductor layer 419 from the first set of contacts 420. A metal layer between the insulating layer 440 and second doped semiconductor layer 419 acts as the one or more contacts 429, and can also act as an optical reflector for light emitted by the device 100. The vias 430 connect contacts 420 to the first doped semiconductor layer 410 through the insulating layer 440, the contact 429, and the second doped semiconductor layer 419, and the vias 430 are electrically insulated from the one or more contacts 429 and from the second doped semiconductor layer 419. In some examples that are thus arranged, the first doped semiconductor layer 410 can be an n-doped layer and the second doped semiconductor layer 419 can be a p-doped layer. The insulating layer 440 can include any one or more suitable materials; in some examples the insulating layer 440 includes doped or undoped silica.

In some examples (e.g., as in FIG. 15A), the vias 430 are connected directly to the first doped semiconductor layer 410 (i.e., arranged as n-vias if the layer 410 is an n-doped layer). In some examples, (e.g., as in FIGS. 15B-15D), an electrode layer 450 is formed on and in direct contact with the first doped semiconductor layer 410. The electrode 450 is substantially transparent for light emitted by the device 100, and the vias 430 connect the first doped semiconductor layer 410 to the contacts 420 by connecting the electrode 450 to the contacts 420. The electrode layer 450 can include any one or more suitable materials; in some examples indium tin oxide (ITO) or indium zinc oxide (IZO) can be employed. In some examples (e.g., as in FIG. 15B), the electrode 450 can be a single contiguous layer spanning most or nearly all of the device 100.

Figure 15A:
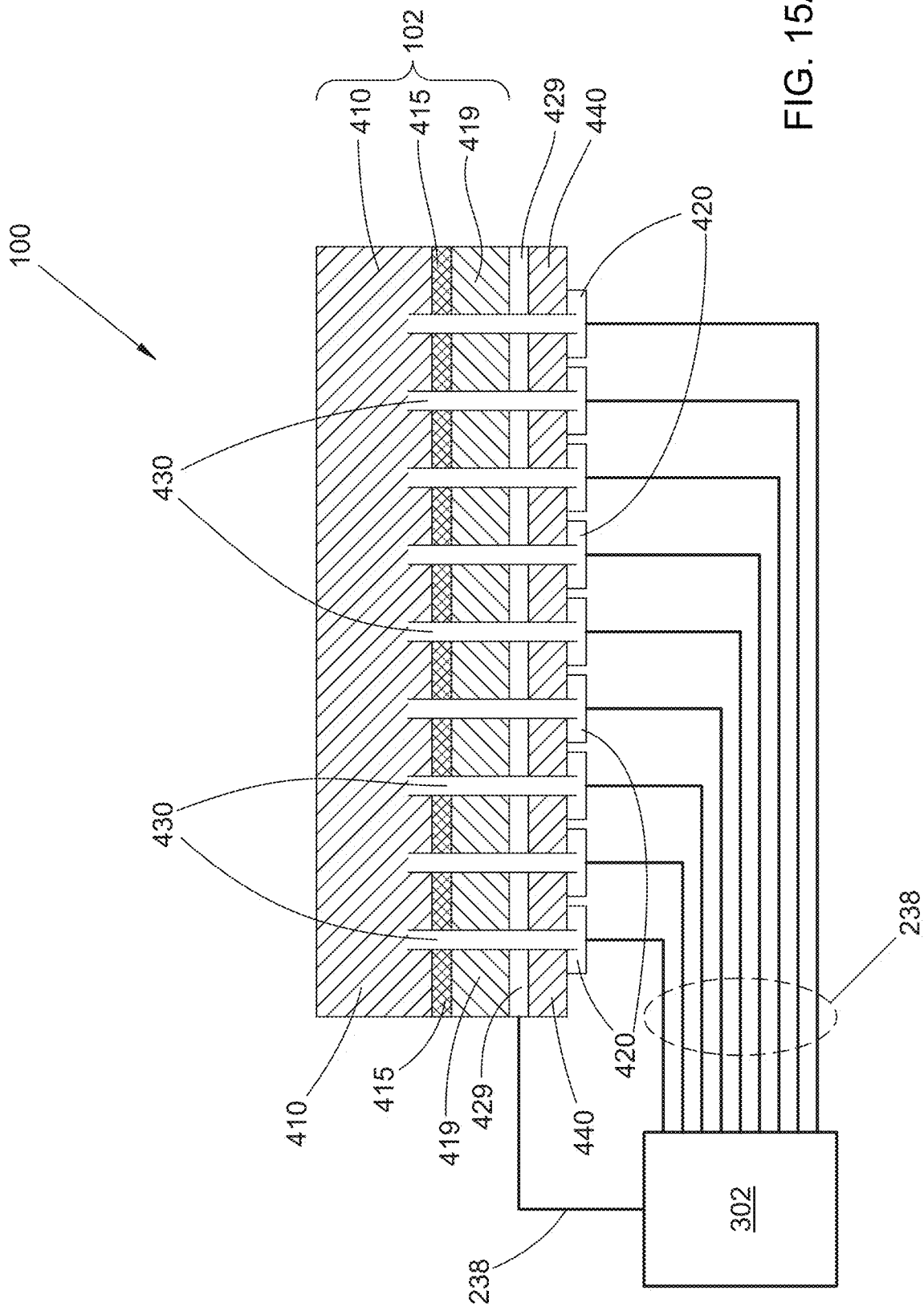
FIGS. 15A through 15D are schematic side cross-sectional views of a second group of example arrangements of an inventive light-emitting device.
Figure 15B:
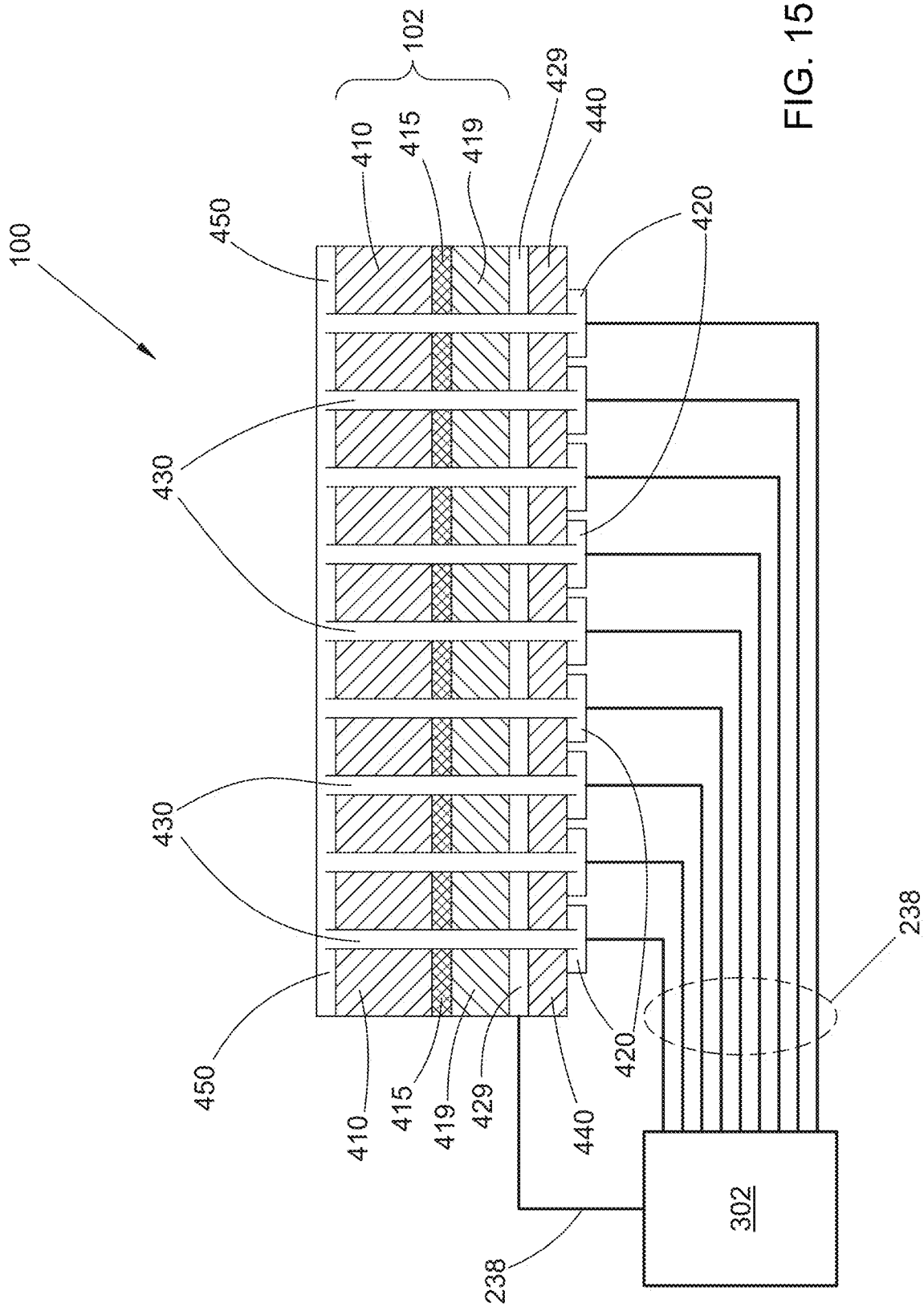
Figure 15C:
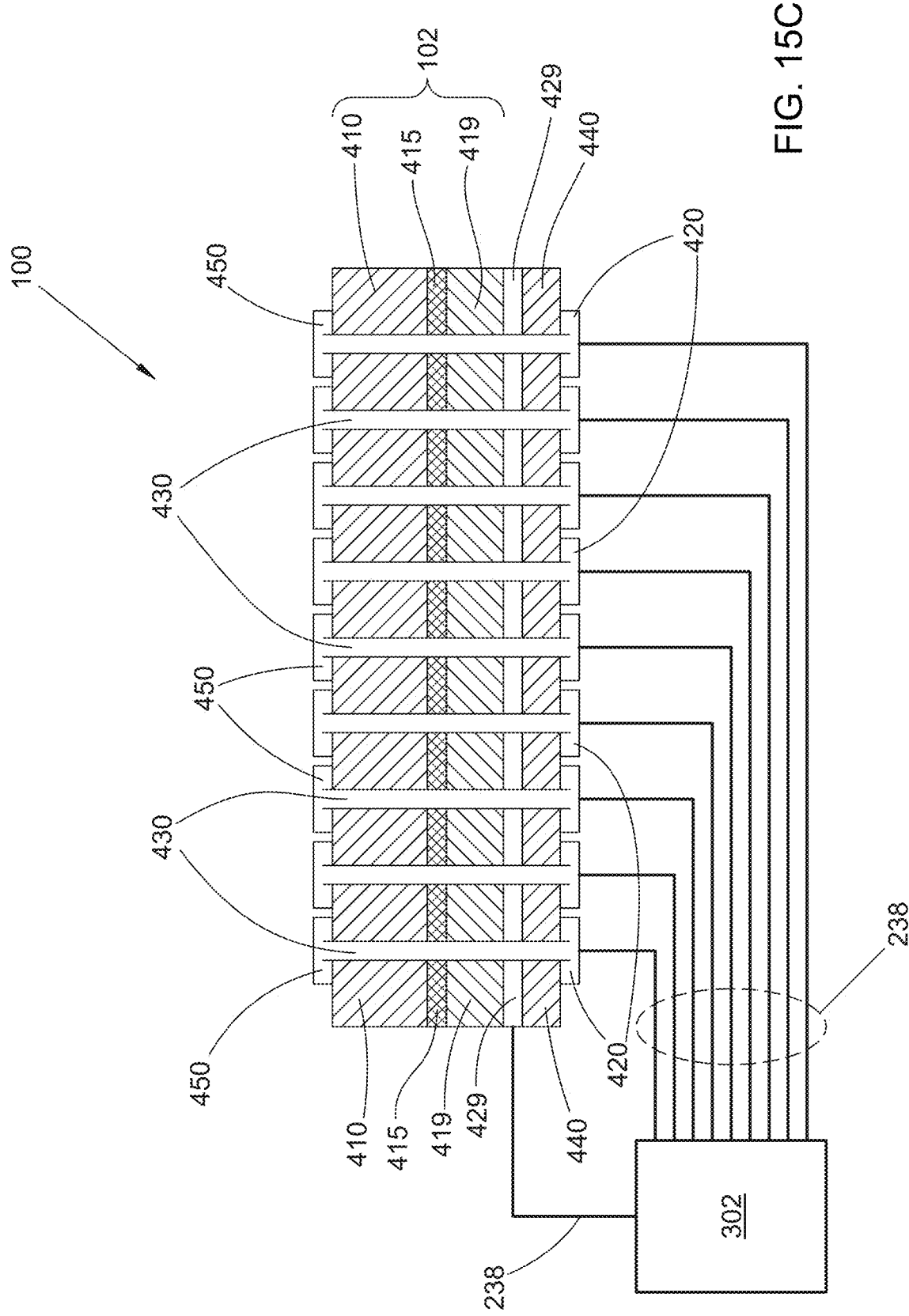
Figure 15D:
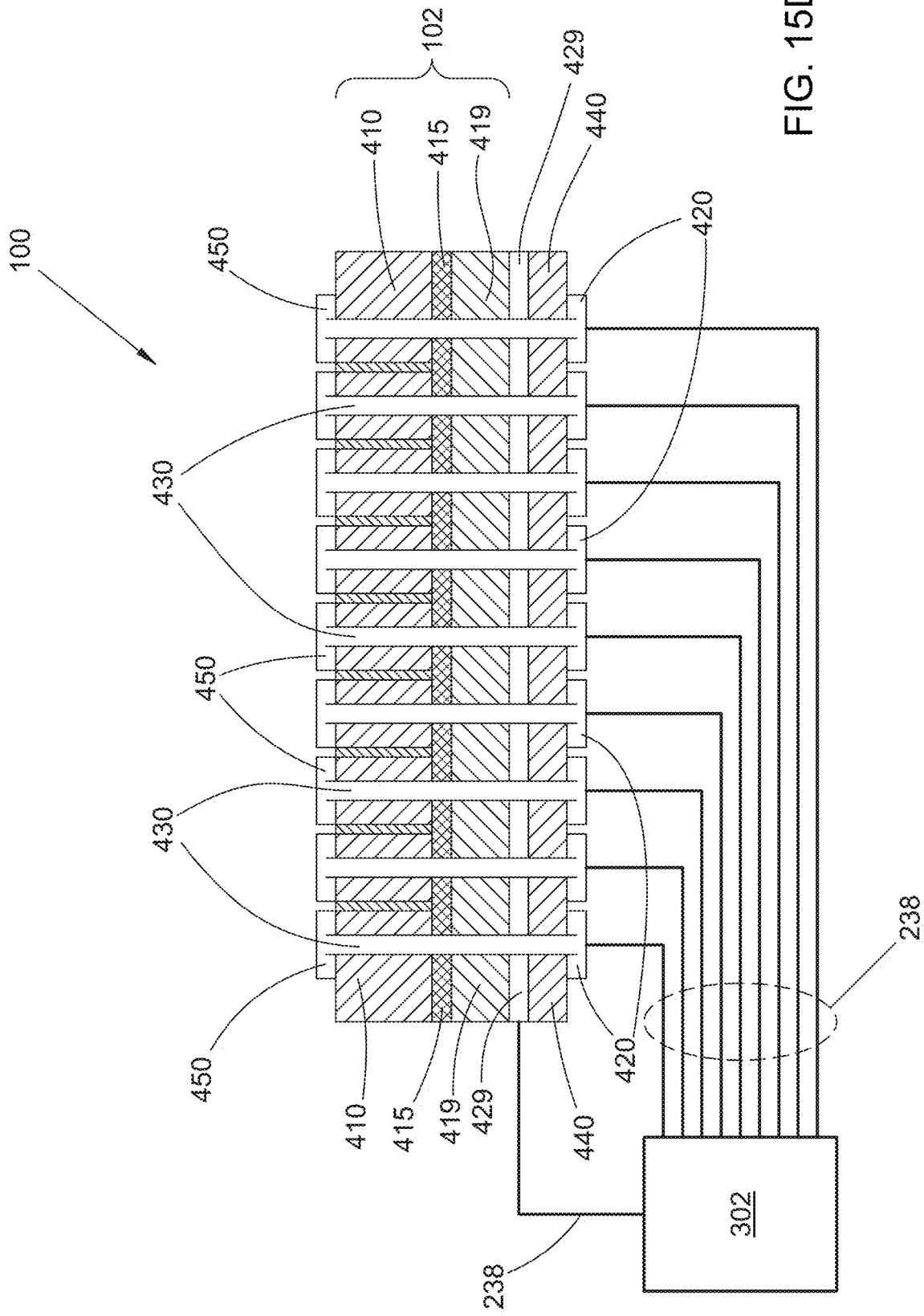

In other examples (e.g., as in FIGS. 15C and 15D), it can be desirable to arrange the electrode layer 450 as multiple discrete areal segments separated by electrically insulating material or empty space, thereby substantially preventing transverse electrical conduction between adjacent areal segments of the electrode layer 450. In some examples that include such an arrangement, each areal segment of the electrode layer 450 can be connected to at most one corresponding contact 420 by one or more corresponding vias 430; in other examples that include such an arrangement, each areal segment of the electrode layer 450 can be connected to multiple different contacts 420 by corresponding vias 430. As noted above, the segmentation of the electrode layer 450 can enhance the spatial resolution of the carrier recombination spatial distribution provided by the vias 430, by somewhat limiting the transverse movement of charge carriers to or from any given via 430 to the area occupied by the corresponding areal segment of the electrode layer 450. In the examples of FIGS. 15A-15C, the first doped semiconductor 410 can be a single contiguous layer spanning most or nearly all of the device 100 (except for, e.g., other vias that pass through it, if present). Further enhancement of spatial resolution can be achieved in some examples (e.g., as in FIG. 15D), by division of the first doped semiconductor layer 410 into multiple discrete areal segments separated by electrically insulating material. As noted above, in such an arrangement movement of charge carriers between a given contact 420 and the junction is confined transversely by insulating material separating the corresponding areal segments of the electrode layer 450 and the first doped semiconductor layer 410 from adjacent segments. If suitable or desirable, in some examples the second doped semiconductor layer 419 can be similarly divided into discrete areal segments (not shown).

In some instances the arrangements of FIGS. 14A-14D may be advantageous relative to the arrangement of FIGS. 15A-15D, for a number of reasons. Because the arrangements of FIGS. 15A-15D require vias 430 that pass through the active layer 415 between the doped semiconductor layers 410/419 and preclude carrier recombination and light emission from the areas occupied by the vias 430, those arrangements necessarily include dark spots in the emission intensity distribution corresponding to the locations of the vias 430. Because vias 430 are not required to cross the active layer 415 in the arrangements of FIGS. 14A-14D, such dark spots can be reduced or eliminated. In addition, vias 430 formed in the arrangements of FIGS. 15A-15D must pass entirely through one of the doped semiconductor layers, through the active layer 415, and into the other doped semiconductor layer. Those vias 430 also must be electrically insulated from those layers. In contrast, the vias 430 in the arrangements of FIGS. 14A-14D typically pass through fewer layers (in some instances through only a single layer of insulating material) and do not pass through the active layer 415. As a result, the fabrication process for forming the vias 430 for the arrangement of FIGS. 15A-15D is necessarily more complex and includes additional deposition, mask, and etch steps, compared to a fabrication process for forming the vias 430 for the arrangements of FIGS. 14A-14D. In particular, formation of vias 430 that pass through one or more active layers or quantum wells of the active layer 415 between the doped semiconductor layers 410/419 can be particularly problematic.

In addition to the vias 430 connected to the contacts 420, in some examples the first set of contacts 420 can include one or more edge contacts positioned about the periphery of the device 100 (not shown). In some examples, the second set of contacts 429 can include one or more edge contacts positioned about the periphery of the device 100 (e.g., as in FIGS. 15A-15D), or can include one or more areal contacts 429 on the same side of the device 100 as the contacts 420 (not shown) or on the opposite side of the device 100 (e.g., as in FIGS. 14A-14D). The arrangements shown in FIGS. 14A-14D and 15A-15D are chosen as a matter of convenience only, because they result in less cluttered drawings; similarly, additional conductive or insulating layers that might be employed for establishing connections among the doped semiconductor layers 410/419, the contacts 420/429, or the drive circuit 302 are omitted from the drawings for clarity.

In some examples, the device 100 can include a second array of multiple electrically conductive vias (not shown) arranged across the device 100. In such examples the vias of that second array can connect contacts 429 to the second doped semiconductor layer 419, and each such via provides a corresponding discrete, localized, circumscribed electrical connection between the second doped semiconductor layer 419 and a corresponding contact 429. In some examples that include a second array of vias, the second set of contacts 429 can include multiple independent electrically conductive contacts 429, and each via of the second array can connect at most one corresponding contact 429 of the second set to the second doped semiconductor layer; in other words, in those examples the contacts 429 and the vias of the second array can be arranged as described above for the contacts 420 and the vias 430 of the first array.

The various arrangements described above for the multiple independent contacts 420 and the multiple vias 430 can be employed to conduct differing corresponding via currents through each of the vias 430, resulting in position dependent carrier recombination density and corresponding position dependent light emission intensity produced by the device 100. To achieve that result, an inventive light-emitting device 100 can include a drive circuit 302 connected to the first and second sets of contacts 420/429 by corresponding electrical traces or interconnects 238. The traces or interconnects 238 that connect independent contacts 420 to the drive circuit 302 are themselves also independent of one another ("independent" as defined above). Note that in some examples multiple contacts 420 can be connected to a single, common trace or interconnect 238; in such an instance those commonly connected contacts 420 act collectively as a single contact, that is independent of other contacts 420 not connected to the same trace 238. The drive circuit 302 can be arranged in any suitable way and can include any suitable set of components or circuit elements, including but not limited to analog components, digital components, active components, passive components, ASICs, computer components (e.g., processors, memory, or storage media), analog-to-digital or digital-to-analog converters, and so forth. The drive circuit 302 provides electrical drive current that flows through the device 100 and causes the device 100 to emit light. The drive circuit 302 is further structured and connected so that (i) corresponding portions of the electrical drive current flow through one or more of the vias 430 as corresponding via currents, and (ii) each via current magnitude differs from the corresponding via current magnitude of at least one other of the vias 430. In other words, the via current magnitudes can differ among the different via 430, and the spatial distribution of those via current magnitudes determines the local carrier recombination density, which in turn determines the local light emission intensity.

The drive circuit 302 can be structured, connected, and operated in any suitable way. Behavior or performance of some inventive devices of the present disclosure are based on differing via current magnitudes flowing through different corresponding vias 430. In some examples the drive circuit 302 can operate as a current source, with a corresponding specified current flowing from the drive circuit along each independent trace 238. Current flowing along each trace 238 might then flow through a single via 430 connected to that trace 238, or might be subdivided among multiple vias 430 connected to that trace 238. In such examples the current delivered along a given trace 238 would be scaled according to the desired via current through each connected via 430 and the number of such vias 430 connected to that trace 238. In other examples, the drive circuit can operate as a voltage source, with a corresponding specified voltage applied to each independent trace 238. Assuming identical vias 430, the current flowing through each trace would be proportional to the applied voltage and the number of vias 430 connected to that trace. In either current-source or voltage-source arrangements, various series or parallel connections can be made between the drive circuit 302 and the vias 430, or among the vias 430, that result in different via current distributions. Such circuit or wiring arrangements can vary widely, and fall within the scope of the present disclosure and appended claims. As already noted, the present disclosure is focused on different via currents delivered to the vias 430, regardless of the particular circuit or wiring arrangement contrived to provide those different via currents.

In some examples the traces or interconnects 238, the contacts 420, and the vias 430 can be connected one-to-one-to-one, enabling individual control over the via current magnitude flowing through each via 430, independent of via current magnitudes flowing through the other vias 430 of the array. Such fine-grained control may not be necessary in every instance, so in some examples some or all of the contacts 420 can each be connected to multiple corresponding vias 430, and some or all of the vias 430 can be connected to a corresponding contact 420 along with one or more other vias 430. Similarly, in some examples some or all of the traces or interconnects 238 can each be connected to multiple corresponding electrodes 420, and some or all of the electrodes 420 can be connected to a corresponding trace or interconnect 238 along with one or more other electrodes 420. In such arrangements, current flowing through a contact 420 would be substantially equally divided among the vias 430 connected to it (assuming substantially identical vias 430), so that substantially equal via current magnitudes flow through each of those multiple vias 430 that are connected to the same contact 420.

In one specific such example, the vias 430 can be arranged in multiple rows that each includes multiple vias 430. A "row" is defined as a subset of the vias 430 that are all at the same distance, or within a relative narrow range of distances, from one edge of the device 100. Examples of such rows can include, e.g., multiple vias 430 arranged along a single straight line or along a zigzagging line (e.g., as might arise if the row included multiple vertices of a row of hexagonal unit cells). Whatever its detailed arrangement, each row extends across the device 100 along a first transverse dimension and the multiple rows can be arranged across the device 100 along a second, orthogonal transverse dimension. Each via 430 of a given row can be connected to a single corresponding contact 420 that is different from corresponding contacts 420 connected to one or more other row of vias 430. Each row current is the sum of the via current magnitudes flowing through the corresponding vias 430 of that row. In some examples the rows and contacts 420 can be connected one-to-one; in other examples one or more of the contacts 420 can be connected to a group of multiple rows. In some examples the vias 430 can be organized into rows not by connecting contacts 420 to multiple vias 430 directly, but instead by configuring the drive circuit 302 to deliver the same via drive current magnitude to all of the vias 430 that make up a given row through their corresponding independent contacts 420.

Such grouping of the vias 430 into rows, whether by direct connection to common contacts 420 or common traces or interconnects 238, or by operation of the drive circuit 302 for coupled driving of certain groups of independent vias 430, can be well-suited for producing a so-called sloped light emission intensity distribution that has a maximum at or relatively near a first edge of the device and decreases monotonically toward the opposite edge of the device 100 (discussed further below). To achieve such an emission intensity distribution, the drive circuit can provide a corresponding row current to each row that decreases monotonically across the device 100 along the second transverse dimension (i.e., perpendicular to the rows).

There are several ways in which differing via current magnitudes can be applied among the multiple vias 430. In many examples the via current magnitude will have minimum and maximum values that can be delivered by the drive circuit 302; in many of those examples the minimum via current magnitude can be about equal to zero. In some examples, each via 430 (or group of vias 430 connected to the same contact 420) can be either "off" (carrying the minimum via current magnitude) or "on" (carrying the maximum via current magnitude). In some other examples, each via 430 or group of connected vias 430 can also carry via current magnitudes that are between the minimum and maximum (e.g., a percentage or fraction of the maximum via current magnitude), in discrete steps in some examples or over a continuous range in other examples. The drive circuit 302 can be arranged in some examples to deliver those intermediate via current levels as DC currents to the respective vias 430; in other examples the drive circuit 302 can be arranged to apply the specified minimum and maximum via current magnitudes alternating at a frequency above the subjective flicker fusion threshold (e.g., above about 60 Hz, above about 90 Hz, above about 120 Hz, or above about 200 Hz) and with a corresponding duty cycle between zero and one that can be selected for each via 430 (or group of connected vias 430) to achieve the desired time-averaged via current magnitude.

The drive circuit can be arranged to provide one or more specified spatial distributions across the device 100 of the differing via current magnitudes provided to the corresponding vias 430 of the array. Each specified via current magnitude distribution among the vias 430 results in corresponding spatial distribution of carrier recombination and light emission intensity across the device 100. For a desired light emission intensity spatial distribution, a corresponding distribution of via current magnitudes can be specified that results, in combination with the spatial arrangement of the vias 430, in an acceptable approximation of the desired emission distribution. Whether a given approximation is "acceptable" can depend on the particular use of the light-emitting device 100; some uses can have more stringent requirements than others. Various emission distributions can be advantageously employed in automotive applications (e.g., for headlight low or high beams), or in other, non-automotive applications. A method for using an inventive light-emitting device 100 comprises operating the drive circuit 302 to provide a specified spatial distribution of via current magnitudes to the vias 430, causing the device 100 to emit light according to a corresponding emission intensity distribution.

One example of a desired light emission intensity distribution is the sloped distribution mentioned above, wherein the emission intensity is maximum along or near a first edge of the device and decreases in one dimension toward the opposite edge of the device. Such an emission intensity distribution can be advantageously employed in, e.g., low-beam automotive headlights (as in the example of FIGS. 11A/11B). A sloped emission intensity distribution can be approximated by configuring the drive circuit 302 to provide via current magnitudes distributed among the vias 430 that result in the desired carrier recombination distribution, which can be achieved in a number of ways using a regular array of identical vias 430. In some examples the via current magnitude for each via 430 can monotonically decrease with increasing distance from the first edge, either continuously or in steps, using either variable DC currents or variable duty cycle between fixed minimum and maximum via current magnitudes. In one specific example, for a device 100 with a 5×5 array of vias 430, the maximum via current magnitude is applied to each via 430 of the first row, 80% of the maximum is applied to the second row, 60% of the maximum is applied to the third row, 40% of the maximum is applied to the fourth row, and 20% of the maximum is applied to the fifth row (illustrated schematically in FIG. 16A; other array sizes and other position dependencies can be employed).

In some examples each via 430 receives either the minimum or maximum via current magnitude but no intermediate value, and the number of vias 430 receiving the maximum via current magnitude decreases by row across the device 100. In another specific 5×5 example, the maximum via current magnitude is applied to five vias of the first row, four vias of the second row, three vias of the third row, two vias of the fourth row, and one via of the fifth row, while all other vias 430 receive the minimum via current magnitude (illustrated schematically in FIG. 16B; other array sizes and other position dependencies can be employed). Note that between the first edge of the device 100 and those vias 430 closest to that first edge, the light emission intensity typically would increase from the zero just beyond the edge to a maximum intensity near the first row of vias of the device 100. That initial increase typically has no practical effect, and devices exhibiting the initial increase can nevertheless be considered to have a monotonically decreasing light emission intensity profile.

Figure 17B:
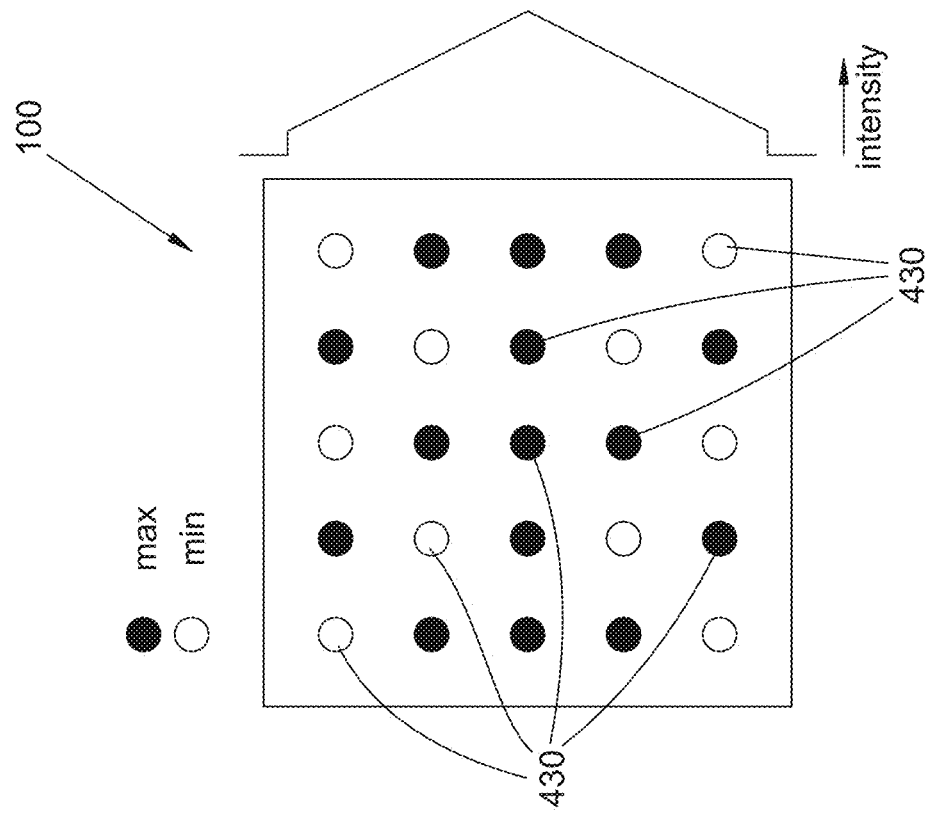
FIGS. 17A and 17B are examples of via current magnitude distributions for producing a 1D-peaked emission intensity distribution using any of the examples of FIGS. 14A-14D or 15A-15D.
Figure 17A:
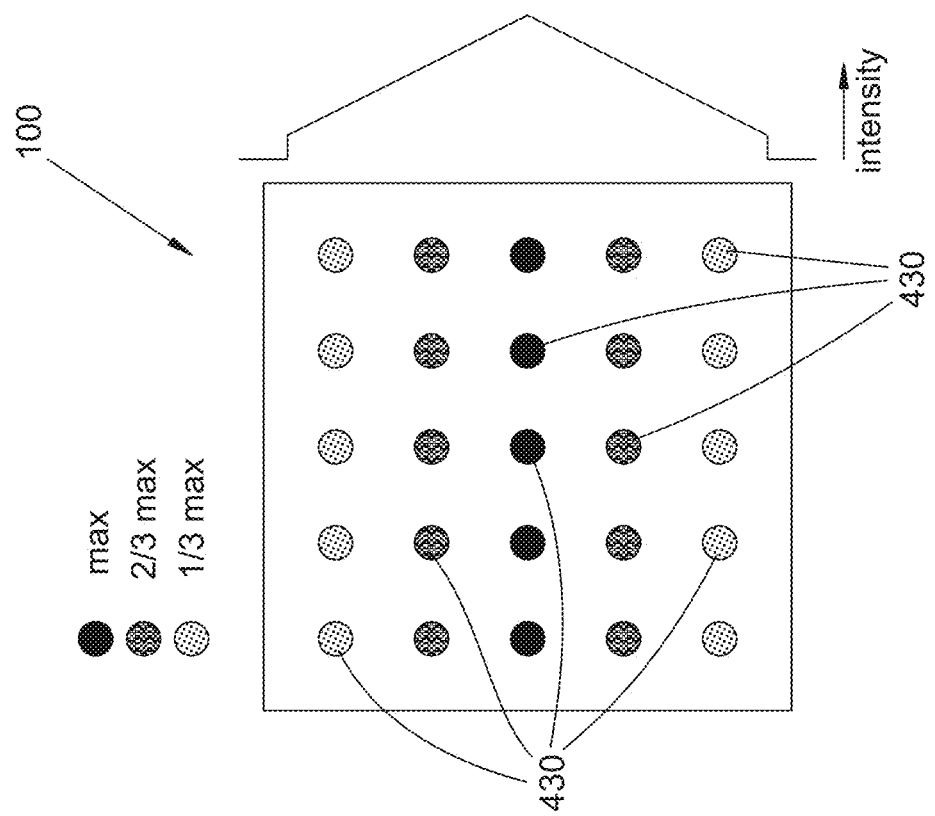

Another example of a desired light emission intensity distribution is a so-called 1D-peaked distribution, wherein the emission intensity has a maximum along a line across a central region of the device 100 and decreases in both directions along one transverse dimension toward opposite edges of the device 100. A 1D-peaked emission intensity distribution can be approximated by configuring the drive circuit 302 to provide via current magnitudes distributed among the vias 430 that result in the desired carrier recombination distribution, which can be achieved in a number of ways using a regular array of identical vias 430. In some examples the via current magnitude for each via 430 can decrease from the center toward the opposite edges, either continuously or in steps, using either variable DC currents or variable duty cycle between fixed minimum and maximum via current magnitudes. In a specific 5×5 example, the maximum via current magnitude is applied to each via 430 of the third row, $2/3$ of the maximum is applied to the second and fourth rows, and $1/3$ of the maximum is applied to the first and fifth rows (illustrated schematically in FIG. 17A; other array sizes and other position dependencies can be employed). In some examples each via 430 receives either the minimum or maximum via current magnitude but no intermediate value, and the number of vias 430 receiving the maximum via current magnitude decreases by row across the device 100 from the central row. In a specific 5×5 example, the maximum via current magnitude is applied to five vias of the third row, three vias of the second and fourth rows, and two vias of the first and fifth rows, while all other vias 430 receive the minimum via current magnitude (illustrated schematically in FIG. 17B; other array sizes and other position dependencies can be employed).

Figure 18B:
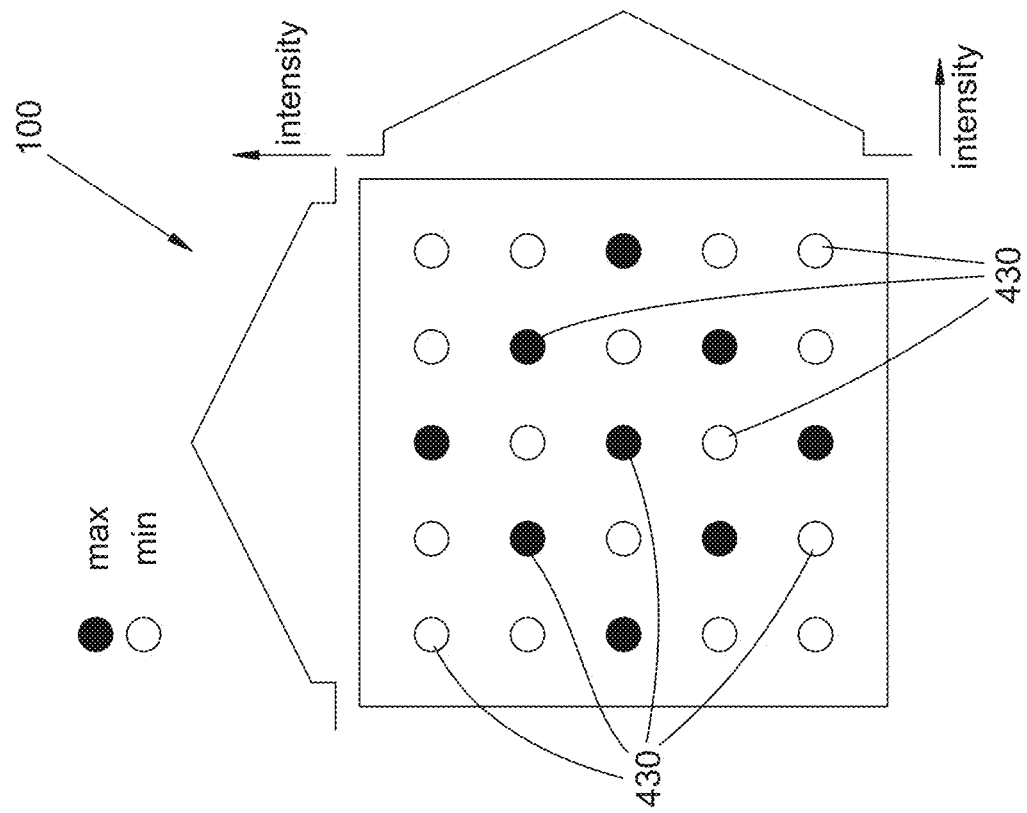
FIGS. 18A and 18B are examples of via current magnitude distributions for producing a 2D-peaked emission intensity distribution using any of the examples of FIGS. 14A-14D or 15A-15D.
Figure 18A:
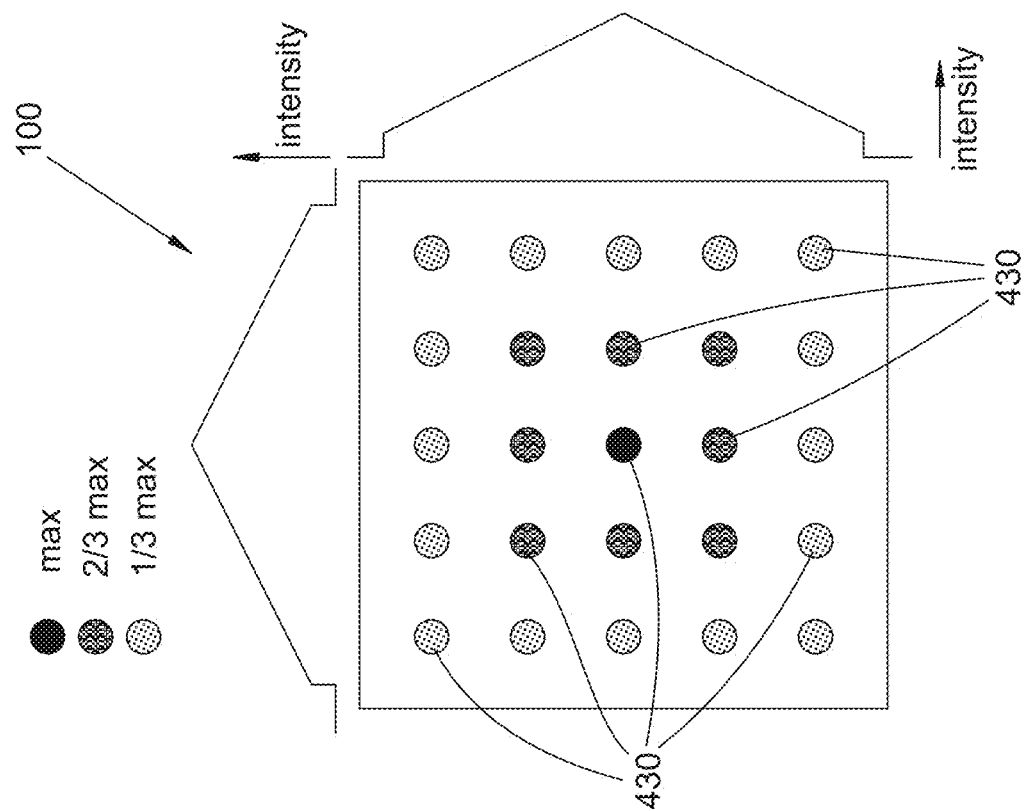

Another example of a desired light emission intensity distribution is a so-called 2D-peaked distribution, wherein the emission intensity has a maximum in a central region of the device 100 and decreases in both directions along both transverse dimensions toward the edges of the device 100. Such an emission intensity distribution can be advantageously employed in, e.g., high-beam automotive headlights. A 2D-peaked slope emission intensity distribution can be approximated by configuring the drive circuit 302 to provide via current magnitudes distributed among the vias 430 that result in the desired carrier recombination distribution, which can be achieved in a number of ways using a regular array of identical vias 430. In some examples the via current magnitude for each via 430 can decrease from the center toward all edges, either continuously or in steps, using either variable DC currents or variable duty cycle between fixed minimum and maximum via current magnitudes. In a specific 5×5 example, the maximum via current magnitude is applied to the center via 430 of the third row, $2/3$ of the maximum is applied to the second through fourth vias 430 of the second and fourth rows and to the second and fourth vias 103 of the third row, and $1/3$ of the maximum is applied to the first and fifth rows and the first and fifth vias of the second through fourth rows (illustrated schematically in FIG. 18A; other array sizes and other position dependencies can be employed). In some examples each via 430 receives either the minimum or maximum via current magnitude but no intermediate value, and the number of vias 430 receiving the maximum via current magnitude decreases distance across the device 100 from the central via 430. In a specific 5×5 example, the maximum via current magnitude is applied to the center via 430 of the third row, the second and fourth vias 430 of the second and fourth rows, the first and fifth vias 430 of the third row, and the third via 430 of the first and fifth rows, while all other vias 430 receive the minimum via current magnitude (illustrated schematically in FIG. 18B; other array sizes and other position dependencies can be employed).

It should be noted that all of the different via current distributions described and shown herein, and myriad others, can all be achieved using a single light-emitting device 100, or by a set of identically arranged light-emitting devices 100. Those different via current distributions, and the corresponding different emission distributions, result from corresponding different modes of operation of the drive circuit 302, illustrating the utility of the various arrangements of the inventive light-emitting device 100, as further elaborated below.

In some examples the drive circuit 302 provides only a single specified spatial distribution across the device 100 of the corresponding magnitudes of the via currents, so that the device is arranged so as to provide only a single corresponding spatial distribution of light emission intensity. Although each device 100 produces only a single emission intensity distribution, a manufacturer can provide a variety of different light-emitting apparatus that produce a variety of corresponding different emission intensity distributions, and yet all incorporate the same light-emitting device 100. The differences in the emission intensity distributions arise from difference between configuration of the drive circuit 302 and its connections among the multiple contacts 420. For example, the six different examples described above could all be made using the same device 100 with a 5×5 array of identical vias 430, because the independence of the contacts 420 enables each the via current magnitude to be applied through a corresponding contact 420 independent of other via currents applied through other contacts 420. The differences among the respective emission intensity distributions of the preceding examples can all be implemented by differences in configuration or operation of their respective drive circuits 302. In a variant, subsequent processing of the device 100 to disable (i.e., render non-conductive) certain vias 430 while leaving others intact can be employed to implement different, static current distributions among different devices 100. Such processing can be implemented in any suitable way, e.g., by ablation of certain vias 430 by a laser or ion beam.

In other examples, the drive circuit 302 can be arranged so as to enable dynamic switching among two or more different specified spatial distributions of via current magnitudes provided by the drive circuit 302. That dynamic switching in turn enables dynamic alteration the spatial distribution of light emission intensity across the device 100, which can be advantageously employed in a variety of ways. Again referring to the 5×5 device examples above, a drive circuit 302 can be configured to enable switching among any two or all three of those emission intensity distributions, simply by suitably rerouting or altering via currents among the vias 430 of the device 100. In automotive headlights, for example, instead of having two separate sets of conventional devices 10 (one sloped and one 2D-peaked) and switching between them for low and high beams, a single set of inventive devices 100 can be employed and the drive circuit 302 used to alter the emission distribution between the sloped distribution (for low beams) and the 2D-peaked distribution (for high beams). Such dynamic control of the emission intensity distribution could also be employed, e.g., for lateral or vertical headlight beam steering as a car makes a turn or crests a hill, or for any number of other automotive and non-automotive purposes.

An inventive method comprises: (A) selecting a first specified spatial distribution of via current magnitudes; (B) operating the drive circuit 302 to provide the first specified spatial distribution of via current magnitudes to the vias 430 and causing the device 100 to emit light according to a corresponding first emission intensity distribution; (C) selecting a second specified spatial distribution of via current magnitudes that differs from the first specified spatial distribution of via current magnitudes; and (D) operating the drive circuit 302 to provide the second specified spatial distribution of via current magnitudes to the vias 430 and causing the device 100 to emit light according to a corresponding second emission intensity distribution that differs from the first emission intensity distribution.

A method for making an inventive light-emitting device 100 comprises: (A) using any one or more suitable spatially selective material processing techniques, forming the first and second doped semiconductor layers 410/419 with the junction or active layer 415 between them; (B) using any one or more suitable spatially selective material processing techniques, forming the array of vias 430 connected to the first doped semiconductor layer 410; (C) using any one or more suitable spatially selective material processing techniques, forming the first set of contacts 420 connected to the first doped semiconductor layer 410 by the array of vias 430; and (D) using any one or more suitable spatially selective material processing techniques, forming the second set of contacts 429 connected to the second doped semiconductor layer 419. Another method for making an inventive light-emitting device comprising connecting the drive circuit 302 to the first and second sets of contacts 420/429 of the light-emitting device 100, and arranging the drive circuit 302 to provide a specified spatial distribution of via current magnitudes to the vias 430.

In some examples, multiple devices 100, each with a corresponding array of vias 430 and independent contacts 420 can be arranged in an array 200. Such an array 200 can comprise multiple devices 100 formed on corresponding separate semiconductor dice and mounted on a common substrate or circuit board, or can comprises multiple devices 100 monolithically formed on a single semiconductor die. The example of FIG. 19 includes three light-emitting devices 100, arranged as in FIG. 14A. An array 200 can be arranged in any of the ways illustrated in FIGS. 14A-14D or 15A-15D. Arrays of any suitable or desired number of light-emitting devices 100 can be employed. The drive circuit 302 can be structured and connected so as to provide one or more specified spatial distributions (including any of the discussed above), across each device 100 of the array 200 and across the array 200 of devices 100, of the via current magnitudes to the corresponding vias 430 of the via array of each device 100 of the device array 200. The spatial distribution of light emission intensity can vary, across each device 100 of the array 200 and across the array 200 of devices 100, according to the arrangement of the array of vias 430 across each device and the specified distribution among the vias 430 of each via array and the devices 100 of the device array 200 of the via current magnitudes provided by the drive circuit 302.

Figure 19:
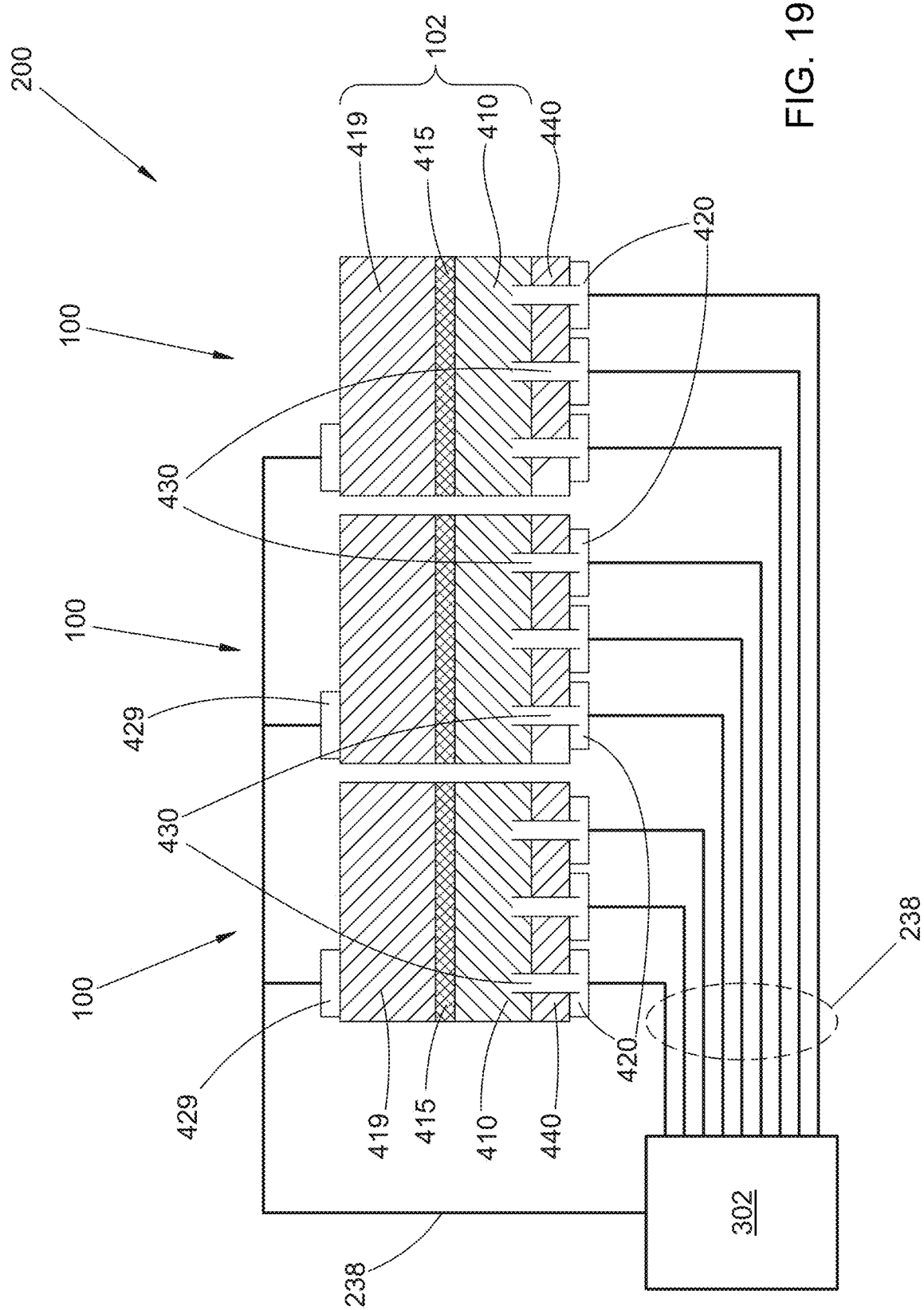
FIG. 19 is a schematic side cross-sectional view of an example of an array of multiple light-emitting devices.
Figure 20:
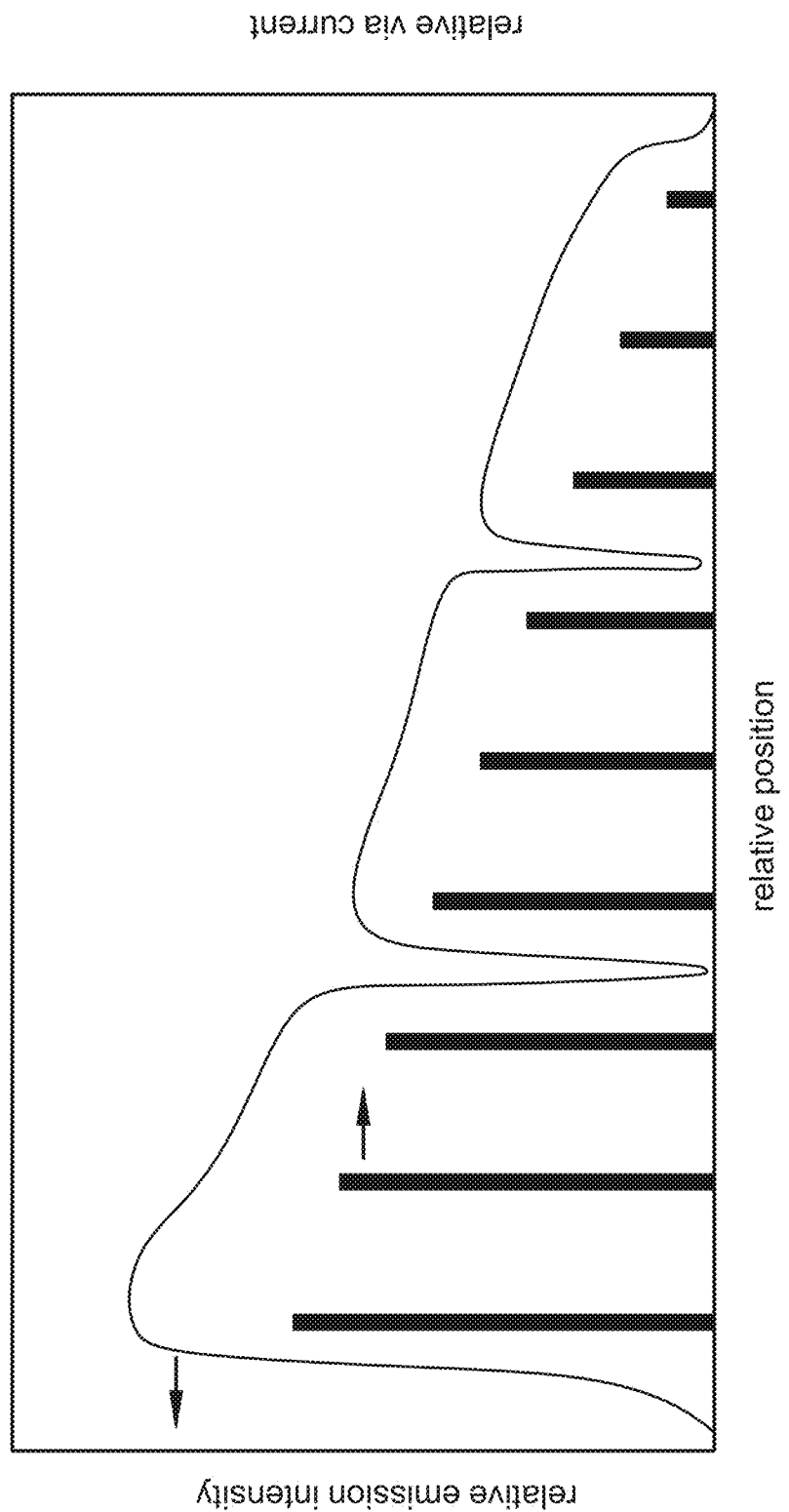
FIGS. 20 and 21 are plots of example emission intensity distributions produced by the example of FIG. 19.
Figure 21:
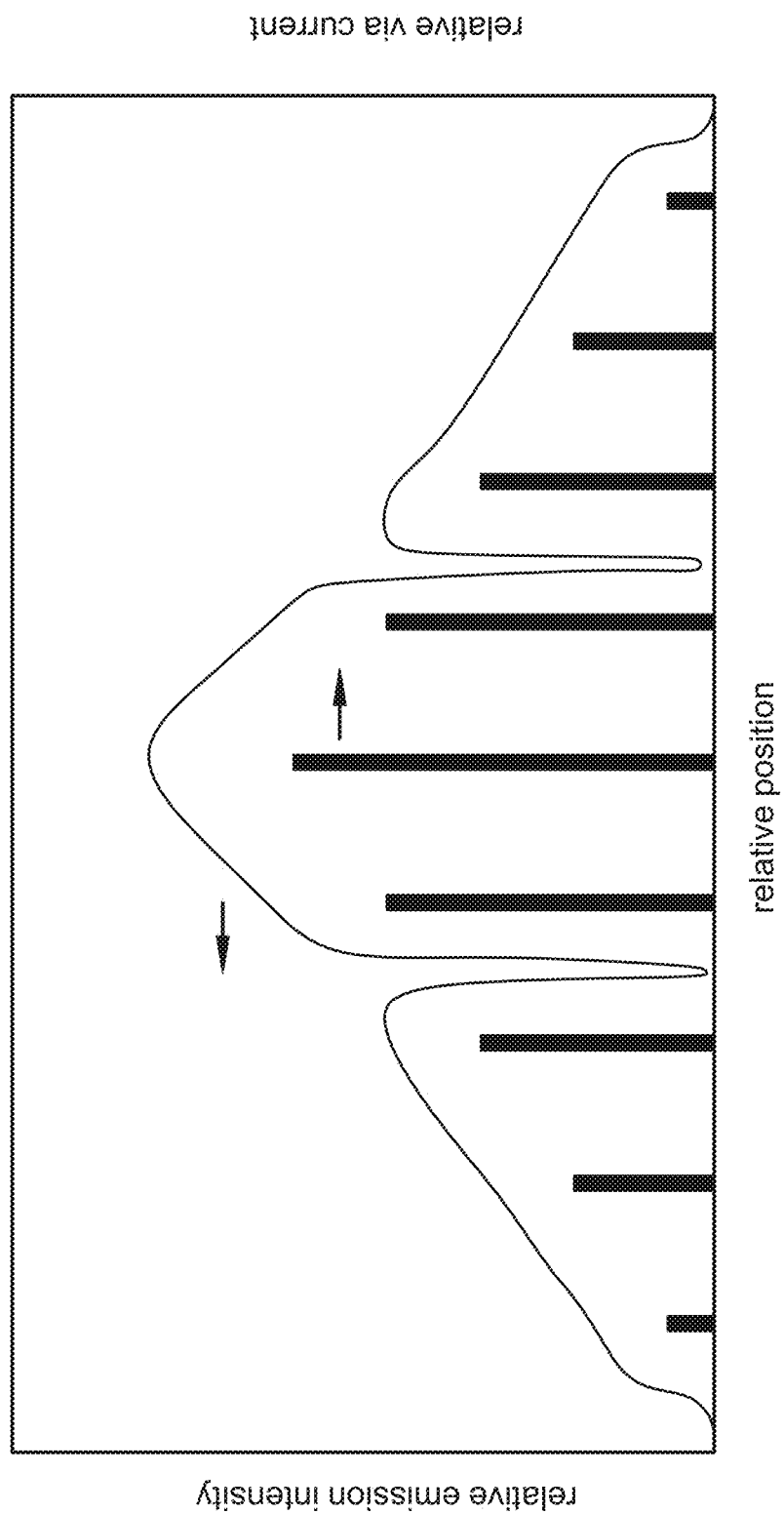

In some examples, specified spatial distributions of via current magnitudes includes a specified spatial distribution that results in corresponding spatial distributions of light emission intensity that differs between adjacent edges of adjacent devices of the array by less than about 30.%, less than about 20.%, or less than about 10.% of a peak emission intensity of the devices of the array. In other words, the emission intensity distributions are "stitched together" to form a desired emission distribution that varies relatively smoothly across the devices 100 of the array 200 (neglecting narrow regions of low emission intensity at the adjoining edges of adjacent devices 100). FIG. 20 shows an example in which the array 200 of FIG. 19 is driven to produce a sloped emission intensity distribution that extends relatively smoothly across the three devices 100 of the array 200 (again, neglecting the steep, narrow intensity minima that occur between the devices 100). FIG. 21 shows an example in which the array 200 of FIG. 19 is driven to produce a 1D-peaked emission intensity distribution that extends relatively smoothly across the three devices 100 of the array 200 (again, neglecting the steep, narrow intensity minima that occur between the devices 100). Any suitable size or arrangement of the array 200 can be employed, including, e.g., devices 100 having transverse dimensions from several millimeters down to under 100 microns, or arrays having a handful of devices 100 up to on the order of 10 s, 100, 1000 s, or more devices 100. For relatively small device sized (e.g., in a microLED array), the number of individual via 430 per device in some instances can be limited by the small size of the individual devices 100. Nevertheless, independently controlled via currents into each devices can smooth out the overall intensity distribution produced by the array (e.g., reducing the appearance of pixilation in an LED display).

Just as with individual devices 100, an array 200 of devices 100 with independently controlled contacts 420 and vias 430 can be operated in any of the ways described above. In some examples the arrangement of the drive circuit 302, traces or interconnects 238, contacts 420, and 430 can produce a fixed emission distribution intensity for a given array 200. An identical array 200 can provide a different emission distribution with a different arrangement of the drive circuit 302. In some examples the arrangement of the drive circuit 302, traces or interconnects 238, contacts 420, and 430 can produce an emission distribution intensity that can be dynamically varies for a given array 200 (as described above).

None of the examples of FIGS. 1-6B as shown includes any of the inventive arrangements of FIGS. 12B, 14A-14D, 15A-15D, or 19. FIGS. 1-6B are examples of devices in which the inventive arrangements of any one of FIGS. 12B, 14A-14D, 15A-15D, or 19 can be advantageously employed, and such implementations shall fall within the scope of the present disclosure and appended claims.

In addition to the preceding, the following example embodiments fall within the scope of the present disclosure or appended claims:

Example 1

A semiconductor light-emitting device (LED) comprising: (a) first and second doped semiconductor layers that are arranged for emitting light resulting from carrier recombination at a junction or active layer between the first and second doped semiconductor layers; (b) a first set of multiple independent electrically conductive contacts each electrically connected to the first doped semiconductor layer; (c) a second set of one or more electrically conductive contacts each electrically connected to the second doped semiconductor layer; (d) an array of multiple electrically conductive vias arranged across the device, the vias of the array connecting contacts of the first set to the first doped semiconductor layer, each via connecting at most one corresponding contact of the first set to the first doped semiconductor layer that is different from a corresponding contact of the first set connected to at least one other via, each via being arranged so as to provide a corresponding discrete, localized, circumscribed electrical connection between the first doped semiconductor layer and the corresponding contact of the first set; and (e) a set of multiple independent electrically conductive traces or interconnects connected to the first set of contacts, each contact of the first set being connected to a single corresponding one of the traces or interconnects that is different from a corresponding trace or interconnect connected to at least one other contact of the first set.

Example 2

The device of Example 1 wherein the contacts of the first and second sets are metal contacts and the vias of the array are metal vias.

Example 3

The device of any one of Examples 1 or 2 wherein the array of vias is arranged across the device as a substantially regular grid of substantially identical vias.

Example 4

The device of any one of Examples 1 or 2 wherein the array of vias is arranged across the device so that one or both of via local number density or via transverse area varies according to position across the device.

Example 5

The device of any one of Examples 1 through 4 wherein each contact of the first set is connected to at most one corresponding via of the array.

Example 6

The device of any one of Examples 1 through 4 wherein one or more contacts of the first set are each connected to multiple corresponding vias of the array.

Example 7

The device of any one of Examples 1 through 6 wherein (i) the first doped semiconductor layer is between the first set of contacts and the second doped semiconductor layer, (ii) the device further comprises an electrically insulating layer between the first doped semiconductor layer and the first set of contacts, and (iii) the vias connect contacts of the first set to the first doped semiconductor layer through the insulating layer.

Example 8

The device of Example 7 wherein the first doped semiconductor layer is a p-doped layer and the second doped semiconductor layer is an n-doped layer.

Example 9

The device of any one of Examples 7 or 8 wherein the contacts of the first set are metal contacts, and the first set of contacts and the insulating layer are arranged so as to act as a composite optical reflector for light emitted by the device.

Example 10

The device of any one of Examples 7 through 9 further comprising an electrode layer between the first doped semiconductor layer and the insulating layer and in contact with the first doped semiconductor layer, wherein the electrode layer is substantially transparent for light emitted by the device, and the vias of the array connect the first doped semiconductor layer to contacts of the first set by connecting the electrode layer to contacts of the first set.

Example 11

The device of Example 10 wherein (i) the electrode layer is arranged as multiple discrete areal segments separated by electrically insulating material so that transverse electrical conduction between adjacent areal segments is substantially prevented, and (ii) each areal segment of the electrode layer is connected to at most one corresponding contact of the first set.

Example 12

The device of any one of Examples 10 or 11 wherein the electrode layer includes indium tin oxide or indium zinc oxide.

Example 13

The device of any one of Examples 1 through 6 wherein (i) the second doped semiconductor layer is between the first set of contacts and the first doped semiconductor layer, (ii) the device further comprises an electrically insulating layer between the second doped semiconductor layer and the first set of contacts, (iii) the vias connect contacts of the first set to the first doped semiconductor layer through the insulating layer and the second doped semiconductor layer, and (iv) the vias are electrically insulated from the second doped semiconductor layer.

Example 14

The device of Example 13 wherein the first doped semiconductor layer is an n-doped layer and the second doped semiconductor layer is a p-doped layer.

Example 15

The device of any one of Examples 13 or 14 further comprising an electrode layer positioned on and in contact with the first doped semiconductor layer, wherein the electrode layer is substantially transparent for light emitted by the device, and the vias of the array connect the first doped semiconductor layer to contacts of the first set by connecting the electrode layer to contacts of the first set.

Example 16

The device of Example 15 wherein (i) the electrode layer is arranged as multiple discrete areal segments separated by electrically insulating material so that transverse electrical conduction between adjacent areal segments is substantially prevented, and (ii) each areal segment of the electrode layer is connected to at most one corresponding contact of the first set.

Example 17

The device of any one of Examples 15 or 16 wherein the electrode layer includes indium tin oxide or indium zinc oxide.

Example 18

The device of any one of Examples 7 through 17 wherein the insulating layer includes doped or undoped silica.

Example 19

The device of any one of Examples 1 through 18 wherein the first doped semiconductor layer includes one or more doped III-V semiconductor materials or alloys thereof, and the second doped semiconductor layer includes one or more III-V semiconductor materials or alloys thereof.

Example 20

The device of any one of Examples 1 through 19 wherein the first doped semiconductor layer is arranged as a contiguous layer substantially spanning the device, and the second doped semiconductor layer is arranged as a contiguous layer substantially spanning the device.

Example 21

The device of any one of Examples 1 through 19 wherein (i) the first doped semiconductor layer is arranged as multiple discrete areal segments separated by electrically insulating material so that transverse electrical conduction between adjacent areal segments is substantially prevented, and (ii) each areal segment of the first doped semiconductor layer is connected to at most one corresponding contact of the first set.

Example 22

The device of Example 21 wherein the second doped semiconductor layer is arranged as multiple discrete areal segments separated by electrically insulating material so that transverse electrical conduction between adjacent areal segments is substantially prevented.

Example 23

The device of any one of Examples 1 through 22 further comprising one or more active semiconductor layers at the junction or active layer between the first and second doped semiconductor layers.

Example 24

The device of any one of Examples 1 through 23 further comprising one or more quantum wells at the junction or active layer between the first and second doped semiconductor layers.

Example 25

The device of any one of Examples 1 through 24 wherein the first set of contacts includes one or more edge contacts.

Example 26

The device of any one of Examples 1 through 25 wherein the second set of contacts includes one or more edge contacts or areal contacts.

Example 27

The device of any one of Examples 1 through 26 further comprising a second array of multiple electrically conductive vias arranged across the device, the vias of the second array connecting contacts of the second set to the second doped semiconductor layer, each via of the second set being arranged so as to provide a corresponding discrete, localized, circumscribed electrical connection between the second doped semiconductor layer and a corresponding contact of the second set.

Example 28

The device of Example 27 wherein the second set of contacts includes multiple independent electrically conductive contacts, each via of the second array connecting at most one corresponding contact of the second set to the second doped semiconductor layer.

Example 29

The device of any one of Examples 1 through 28 further comprising a drive circuit connected to the first and second sets of contacts by the electrical traces or interconnects, the drive circuit being structured and connected so as to provide electrical drive current that flows through the device and causes the device to emit light, and that is further structured and connected so that (i) corresponding portions of the electrical drive current flow through one or more vias of the array as corresponding via currents, and (ii) each via current magnitude differs from the corresponding via current magnitude of at least one other of the vias of the array.

Example 30

The device of Example 29 wherein each electrical trace or interconnect is connected to at most one contact of the first set.

Example 31

The device of Example 29 wherein one or more electrical traces or interconnects are each connected to multiple corresponding contacts of the first set.

Example 32

The device of any one of Examples 29 through 31 wherein each contact of the first set is connected to at most one via of the array so as to enable the corresponding via current magnitude to flow through each via independent of via current magnitudes flowing through the other vias of the array.

Example 33

The device of any one of Examples 29 through 31 wherein one or more contacts of the first set are each connected to multiple corresponding vias of the array, so that substantially equal via current magnitudes flow through each of the multiple vias that are connected to the same contact.

Example 34

The device of Example 33 wherein (i) the vias of the array are arranged in multiple rows and each row includes multiple vias, (ii) each row extends across the device along a first transverse dimension and the multiple rows are arranged across the device along a second, orthogonal transverse dimension, (iii) each via of a given row is connected to the same corresponding contact of the first set, and (iv) each row of vias is connected to a corresponding contact of the first set that is different from a corresponding contact of the first set connected to at least one other row of vias.

Example 35

The device of Example 34 wherein the drive circuit is structured and connected so that a corresponding sum of via current magnitude flowing through the vias of each row decreases monotonically across the device along the second transverse dimension.

Example 36

The device of any one of Examples 29 through 35 wherein the drive circuit is structured and connected so that each via current magnitude is either (i) substantially equal to a specified minimum via current magnitude or (ii) substantially equal to a specified maximum via current magnitude greater than the specified minimum current magnitude.

Example 37

The device of any one of Examples 29 through 35 wherein the drive circuit is structured and connected so that each via current magnitude is (i) substantially equal to a specified minimum via current magnitude, (ii) substantially equal to a specified maximum via current magnitude greater than the specified minimum current magnitude, or (iii) substantially equal to one of one or more discrete specified intermediate via current magnitudes that are between the specified minimum current magnitude and the specified maximum via current magnitude.

Example 38

The device of any one of Examples 29 through 35 wherein the drive circuit is structured and connected so that each via current magnitude is within a continuous range from a specified minimum via current magnitude to a specified maximum via current magnitude greater than the specified minimum current magnitude.

Example 39

The device of any one of Examples 37 or 38 wherein the drive circuit is structured and connected so as to provide to each via of the array a corresponding specified via current magnitude between the specified minimum and maximum current magnitudes by applying the specified minimum and maximum via current magnitudes alternating at a frequency above about 60 Hz and with a corresponding duty cycle between zero and one.

Example 40

The device of any one of Examples 36 through 39 wherein the drive circuit is structured and connected so that the minimum specified via current magnitude is substantially equal to zero.

Example 41

The device of any one of Examples 29 through 40 wherein (i) the drive circuit is structured and connected so as to provide one or more specified spatial distributions across the device of the via current magnitudes provided by the drive circuit to the corresponding vias of the array, and (ii) spatial distribution of light emission intensity varies across the device according to the arrangement of the array of vias across the device and the specified distribution among the vias of the array of the via current magnitudes provided by the drive circuit.

Example 42

The device of Example 41 wherein the one or more specified spatial distributions of via current magnitudes includes a specified spatial distribution that results in a corresponding spatial distribution of light emission intensity that decreases along one transverse dimension across the device from the vias of the array closest to one edge of the device toward an opposite edge of the device.

Example 43

The device of any one of Examples 41 or 42 wherein the one or more specified spatial distributions of via current magnitudes includes a specified spatial distribution that results in a corresponding spatial distribution of emitted light intensity that exhibits a maximum intensity along a line extending across a central region of the device and decreases in both directions along one transverse dimension toward opposite edges of the device.

Example 44

The device of any one of Examples 41 through 43 wherein the one or more specified spatial distributions of via current magnitudes includes a specified spatial distribution that results in a corresponding spatial distribution of emitted light intensity that exhibits a maximum intensity at a central region of the device and decreases in both directions along both transverse dimensions toward edges of the device.

Example 45

The device of any one of Examples 41 through 44 wherein the drive circuit is arranged so as to provide only a single specified spatial distribution across the device of the corresponding magnitudes of the via currents, so that the device is arranged so as to provide only a single corresponding spatial distribution of light emission intensity across the device.

Example 46

The device of any one of Examples 41 through 44 wherein the drive circuit is arranged so as to enable dynamic switching among two or more different specified spatial distributions of via current magnitudes provided by the drive circuit, enabling dynamic alteration the spatial distribution of light emission intensity across the device.

Example 47

A method for using the device of Example 46, the method comprising: (A) selecting a first specified spatial distribution of via current magnitudes; (B) operating the drive circuit to provide the first specified spatial distribution of via current magnitudes to the vias of the array, causing the device to emit light according to a corresponding first spatial distribution of light emission intensity across the device; (C) selecting a second specified spatial distribution of via current magnitudes that differs from the first specified spatial distribution of via current magnitudes; and (D) operating the drive circuit to provide the second specified spatial distribution of via current magnitudes to the vias of the array, causing the device to emit light according to a corresponding second spatial distribution of light emission intensity across the device that differs from the first spatial distribution of light emission intensity.

Example 48

A method for using the device of any one of Examples 45 or 46, the method comprising operating the drive circuit to provide a specified spatial distribution of via current magnitudes to the vias of the array, causing the device to emit light according to a corresponding spatial distribution of light emission intensity across the device.

Example 49

An array of multiple light-emitting devices of any one of Examples 29 through 46.

Example 50

The device of Example 49 wherein (i) the drive circuit is structured and connected so as to provide one or more specified spatial distributions, across each device of the array and across the array of devices, of the via current magnitudes provided by the drive circuit to the corresponding vias of the array of each device, and (ii) spatial distribution of light emission intensity varies, across each device of the array and across the array of devices, according to the arrangement of the array of vias across each device and the specified distribution among the vias of each array and the devices of the array of the via current magnitudes provided by the drive circuit.

Example 51

The device of Example 50 wherein the one or more specified spatial distributions of via current magnitudes includes a specified spatial distribution that results in corresponding spatial distributions of light emission intensity that differs between adjacent edges of adjacent devices of the array by less than about 30.%, less than about 20.%, or less than about 10.% of a peak emission intensity of the devices of the array.

Example 52

The device of any one of Examples 50 or 51 wherein the one or more specified spatial distributions of via current magnitudes includes a specified spatial distribution that results in a corresponding spatial distribution of light emission intensity that (i) decreases along one transverse dimension across the device array from the vias closest to one edge of the device array toward an opposite edge of the device array, (ii) exhibits a maximum intensity along a line extending across a central region of the device array and decreases in both directions along one transverse dimension toward opposite edges of the device array, or (iii) exhibits a maximum intensity at a central region of the device array and decreases in both directions along both transverse dimensions toward edges of the device array.

Example 53

The device of any one of Examples 50 through 52 wherein the drive circuit is arranged so as to provide only a single specified spatial distribution across each device and across the array of devices of the corresponding magnitudes of the via currents, so that the device is arranged so as to provide only a single corresponding spatial distribution of light emission intensity across each device and across the array of devices.

Example 54

The device of any one of Examples 50 through 53 wherein the drive circuit is arranged so as to enable dynamic switching among two or more different specified spatial distributions of via current magnitudes provided by the drive circuit, enabling dynamic alteration the spatial distribution of light emission intensity across each device and across the array of devices.

Example 55

A method for using the device of Example 54, the method comprising: (A) selecting a first specified spatial distribution of via current magnitudes; (B) operating the drive circuit to provide the first specified spatial distribution of via current magnitudes to the vias of the via array of each device of the device array, causing the array of devices to emit light according to a corresponding first spatial distribution of light emission intensity across each device and across the array of devices; (C) selecting a second specified spatial distribution of via current magnitudes that differs from the first specified spatial distribution of via current magnitudes; and (D) operating the drive circuit to provide the second specified spatial distribution of via current magnitudes to the vias of the via array of each device of the device array, causing the array of devices to emit light according to a corresponding second spatial distribution of light emission intensity, across each device and across the array of devices, that differs from the first spatial distribution of light emission intensity.

Example 56

A method for using the device of any one of Examples 53 or 54, the method comprising operating the drive circuit to provide a specified spatial distribution of via current magnitudes to the vias of each via array, causing the device to emit light according to a corresponding spatial distribution of light emission intensity across each device and across the array of devices.

Example 57

A method for making the light-emitting device of any one of Examples 1 through 28, the method comprising: (A) forming the first and second doped semiconductor layers with the junction or active layer between them; (B) forming the array of vias connected to the first doped semiconductor layer; (C) forming the first set of contacts connected to the first doped semiconductor layer by the array of vias; and (D) forming the second set of contacts connected to the second doped semiconductor layer.

Example 58

A method for making the light-emitting device of any one of Examples 29 through 46, the method comprising connecting the drive circuit to the first and second sets of contacts of the light-emitting device, and arranging the drive circuit to provide a specified spatial distribution of via current magnitudes to the vias of the array.

Example 59

An array of multiple light-emitting devices of any one of Examples 1 through 46.

Example 60

A semiconductor light-emitting apparatus comprising: (a) n-doped and p-doped semiconductor layers that are arranged for emitting light resulting from carrier recombination at a junction or active layer between the n-doped and p-doped semiconductor layers; (b) a first set of one or more electrically conductive contacts each electrically connected to the p-doped semiconductor layer, and a second set of one or more electrically conductive contacts each electrically connected to the n-doped semiconductor layer; and (c) an array of multiple electrically conductive vias arranged across the device, the vias of the array connecting contacts of the first set to the p-doped semiconductor layer, each via being arranged so as to provide a corresponding discrete, localized, circumscribed electrical connection between the p-doped semiconductor layer and the corresponding contact of the first set, (d) wherein the array of vias is arranged across the device so that one or both of via local number density or via transverse area varies according to position across the device and results in a corresponding spatial distribution of light emission intensity that varies across the device according to the arrangement of the array of vias.

Example 61

The device of Example 60 wherein further comprising an electrically insulating layer between the p-doped semiconductor layer and the first set of contacts, wherein the vias connect contacts of the first set to the p-doped semiconductor layer through the insulating layer.

Example 62

The device of Example 61 wherein the contacts of the first set are metal contacts, and the first set of contacts and the insulating layer are arranged so as to act as a composite optical reflector for light emitted by the device.

Example 63

The device of Example 62 further comprising an electrode layer between the p-doped semiconductor layer and the insulating layer and in contact with the p-doped semiconductor layer, wherein the electrode layer is substantially transparent for light emitted by the device, and the vias of the array connect the p-doped semiconductor layer to contacts of the first set by connecting the electrode layer to contacts of the first set.

Example 64

The device of Example 63 wherein the electrode layer includes indium tin oxide or indium zinc oxide.

Example 65

The device of any one of Examples 60 through 64 wherein the insulating layer includes doped or undoped silica.

Example 66

The device of any one of Examples 60 through 65 wherein the p-doped semiconductor layer includes one or more doped III-V semiconductor materials or alloys thereof, and the n-doped semiconductor layer includes one or more III-V semiconductor materials or alloys thereof.

Example 67

The device of any one of Examples 60 through 66 wherein the first set of contacts includes one or more edge contacts.

Example 68

The device of any one of Examples 60 through 67 wherein the second set of contacts includes one or more edge contacts or areal contacts.

Example 69

The device of any one of Examples 60 through 68 further comprising a second array of multiple electrically conductive vias arranged across the device, the vias of the second array connecting contacts of the second set to the n-doped semiconductor layer, each via of the second set being arranged so as to provide a corresponding discrete, localized, circumscribed electrical connection between the n-doped semiconductor layer and a corresponding contact of the second set.

Example 70

A method for using the device of any one of Examples 60 through 69, the method comprising applying a common drive signal to the first set of one or more contacts, causing the device to emit light according to the corresponding spatial distribution of light emission intensity across the device.

Example 71

A method for making the light-emitting device of any one of Examples 60 through 69, the method comprising: (A) forming the n-doped and p-doped semiconductor layers with the junction or active layer between them; (B) forming the array of vias connected to the p-doped semiconductor layer; (C) forming the first set of one or more contacts connected to the p-doped semiconductor layer by the array of vias; and (D) forming the second set of one or more contacts connected to the n-doped semiconductor layer.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without any dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC §112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor light-emitting device comprising:
    first and second doped semiconductor layers that are arranged for emitting light resulting from carrier recombination at a junction or active layer between the first and second doped semiconductor layers;
    a first set of multiple independent electrically conductive contacts each electrically connected to the first doped semiconductor layer;
    a second set of one or more electrically conductive contacts each electrically connected to the second doped semiconductor layer;
    an array of multiple electrically conductive vias arranged across the device, the vias of the array connecting contacts of the first set to the first doped semiconductor layer, each via connecting at most one corresponding contact of the first set to the first doped semiconductor layer that is different from a corresponding contact of the first set connected to at least one other via, each via being arranged so as to provide a corresponding discrete, localized, circumscribed electrical connection between the first doped semiconductor layer and the corresponding contact of the first set; and
    a set of multiple independent electrically conductive traces or interconnects connected to the first set of contacts, each contact of the first set being connected to a single corresponding one of the traces or interconnects that is different from a corresponding trace or interconnect connected to at least one other contact of the first set.

2. The device of claim 1 wherein the array of vias is arranged across the device as a substantially regular grid of substantially identical vias.

3. The device of claim 1 wherein (i) the first doped semiconductor layer is between the first set of contacts and the second doped semiconductor layer, (ii) the device further comprises an electrically insulating layer between the first doped semiconductor layer and the first set of contacts, and (iii) the vias connect contacts of the first set to the first doped semiconductor layer through the insulating layer.

4. The device of claim 3 wherein the contacts of the first set are metal contacts, and the first set of contacts and the insulating layer are arranged so as to act as a composite optical reflector for light emitted by the device.

5. The device of claim 3 further comprising an electrode layer between the first doped semiconductor layer and the insulating layer and in contact with the first doped semiconductor layer, wherein the electrode layer is substantially transparent for light emitted by the device, and the vias of the array connect the first doped semiconductor layer to contacts of the first set by connecting the electrode layer to contacts of the first set.

6. The device of claim 5 wherein (i) the electrode layer is arranged as multiple discrete areal segments separated by electrically insulating material so that transverse electrical conduction between adjacent areal segments is substantially prevented, and (ii) each areal segment of the electrode layer is connected to at most one corresponding contact of the first set.

7. The device of claim 1 wherein (i) the second doped semiconductor layer is between the first set of contacts and the first doped semiconductor layer, (ii) the device further comprises an electrically insulating layer between the second doped semiconductor layer and the first set of contacts, (iii) the vias connect contacts of the first set to the first doped semiconductor layer through the insulating layer and the second doped semiconductor layer, and (iv) the vias are electrically insulated from the second doped semiconductor layer.

8. The device of claim 1 further comprising a second array of multiple electrically conductive vias arranged across the device, the vias of the second array connecting contacts of the second set to the second doped semiconductor layer, each via of the second set being arranged so as to provide a corresponding discrete, localized, circumscribed electrical connection between the second doped semiconductor layer and a corresponding contact of the second set.

9. The device of claim 1 further comprising a drive circuit connected to the first and second sets of contacts by the electrical traces or interconnects, the drive circuit being structured and connected so as to provide electrical drive current that flows through the device and causes the device to emit light, and that is further structured and connected so that (i) corresponding portions of the electrical drive current flow through one or more vias of the array as corresponding via currents, and (ii) each via current magnitude differs from the corresponding via current magnitude of at least one other of the vias of the array.

10. The device of claim 9 wherein each contact of the first set is connected to at most one via of the array so as to enable the corresponding via current magnitude to flow through each via independent of via current magnitudes flowing through the other vias of the array.

11. The device of claim 9 wherein one or more contacts of the first set are each connected to multiple corresponding vias of the array, so that substantially equal via current magnitudes flow through each of the multiple vias that are connected to the same contact.

12. The device of claim 9 wherein (i) the drive circuit is structured and connected so as to provide one or more specified spatial distributions across the device of the via current magnitudes provided by the drive circuit to the corresponding vias of the array, and (ii) spatial distribution of light emission intensity varies across the device according to the arrangement of the array of vias across the device and the specified distribution among the vias of the array of the via current magnitudes provided by the drive circuit.

13. The device of claim 12 wherein the one or more specified spatial distributions of via current magnitudes includes a specified spatial distribution that results in a corresponding spatial distribution of light emission intensity that (i) decreases along one transverse dimension across the device from the vias of the array closest to one edge of the device toward an opposite edge of the device, (ii) exhibits a maximum intensity along a line extending across a central region of the device and decreases in both directions along one transverse dimension toward opposite edges of the device, or (iii) exhibits a maximum intensity at a central region of the device and decreases in both directions along both transverse dimensions toward edges of the device.

14. The device of claim 12 wherein the drive circuit is arranged so as to provide only a single specified spatial distribution across the device of the corresponding magnitudes of the via currents, so that the device is arranged so as to provide only a single corresponding spatial distribution of light emission intensity across the device.

15. The device of claim 12 wherein the drive circuit is arranged so as to enable dynamic switching among two or more different specified spatial distributions of via current magnitudes provided by the drive circuit, enabling dynamic alteration the spatial distribution of light emission intensity across the device.

16. A method for using the device of claim 15, the method comprising:
(A) selecting a first specified spatial distribution of via current magnitudes;
(B) operating the drive circuit to provide the first specified spatial distribution of via current magnitudes to the vias of the array, causing the device to emit light according to a corresponding first spatial distribution of light emission intensity across the device;
(C) selecting a second specified spatial distribution of via current magnitudes that differs from the first specified spatial distribution of via current magnitudes; and
(D) operating the drive circuit to provide the second specified spatial distribution of via current magnitudes to the vias of the array, causing the device to emit light according to a corresponding second spatial distribution of light emission intensity across the device that differs from the first spatial distribution of light emission intensity.

17. A method for using the device of claim 12, the method comprising operating the drive circuit to provide a specified spatial distribution of via current magnitudes to the vias of the array, so as to cause the device to emit light according to a corresponding spatial distribution of light emission intensity across the device.

18. A light-emitting device array comprising:
an array of multiple light-emitting devices, each device of the array comprising:
corresponding first and second doped semiconductor layers that are arranged for emitting light resulting from carrier recombination at a junction or active layer therebetween;
a corresponding first set of multiple independent electrically conductive contacts each electrically connected to the first doped semiconductor layer;
a corresponding second set of one or more electrically conductive contacts each electrically connected to the second doped semiconductor layer;
a corresponding array of multiple electrically conductive vias arranged across the device, the vias of the array connecting contacts of the first set to the first doped semiconductor layer, each via connecting at most one corresponding contact of the first set to the first doped semiconductor layer that is different from a corresponding contact of the first set connected to at least one other via, each via being arranged so as to provide a corresponding discrete, localized, circumscribed electrical connection between the first doped semiconductor layer and the corresponding contact of the first set;
a corresponding set of multiple independent electrically conductive traces or interconnects connected to the first set of contacts, each contact of the first set being connected to a single corresponding one of the traces or interconnects that is different from a corresponding trace or interconnect connected to at least one other contact of the first set; and
a drive circuit connected to each corresponding first and second sets of contacts by the corresponding electrical traces or interconnects, the drive circuit being structured and connected so as to provide electrical drive current that flows through each device and causes each device to emit light, and that is further structured and connected so that (i) corresponding portions of the electrical drive current flow through one or more vias of the each via array of each device as corresponding via currents, and (ii) each via current magnitude differs from the corresponding via current magnitude of at least one other of the vias of each via array.

19. The array of claim 18 wherein (i) the drive circuit is structured and connected so as to provide one or more specified spatial distributions, across each device of the array and across the array of devices, of the via current magnitudes provided by the drive circuit to the corresponding vias of the array of each device, and (ii) spatial distribution of light emission intensity varies, across each device of the array and across the array of devices, according to the arrangement of the array of vias across each device and the specified distribution among the vias of each array and the devices of the array of the via current magnitudes provided by the drive circuit.

20. A method for using the array of claim 19, the method comprising:

- selecting a first specified spatial distribution of via current magnitudes;
- operating the drive circuit to provide the first specified spatial distribution of via current magnitudes to the vias of the via array of each device of the device array, causing the array of devices to emit light according to a corresponding first spatial distribution of light emission intensity across each device and across the array of devices;
- selecting a second specified spatial distribution of via current magnitudes that differs from the first specified spatial distribution of via current magnitudes; and
- operating the drive circuit to provide the second specified spatial distribution of via current magnitudes to the vias of the via array of each device of the device array, causing the array of devices to emit light according to a corresponding second spatial distribution of light emission intensity, across each device and across the array of devices, that differs from the first spatial distribution of light emission intensity.

* * * * *